United States Patent
Harris et al.

(10) Patent No.: US 11,348,024 B2
(45) Date of Patent: May 31, 2022

(54) UNIVERSAL ADIABATIC QUANTUM COMPUTING WITH SUPERCONDUCTING QUBITS

(71) Applicant: D-WAVE SYSTEMS INC., Burnaby (CA)

(72) Inventors: Richard G. Harris, North Vancouver (CA); Mohammad H. Amin, Coquitlam (CA); Anatoly Smirnov, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 842 days.

(21) Appl. No.: 16/029,040

(22) Filed: Jul. 6, 2018

(65) Prior Publication Data

US 2018/0314970 A1   Nov. 1, 2018

Related U.S. Application Data

(62) Division of application No. 14/520,139, filed on Oct. 21, 2014, now Pat. No. 10,037,493.
(Continued)

(51) Int. Cl.
*G06N 10/00* (2019.01)
*H03K 3/38* (2006.01)
(Continued)

(52) U.S. Cl.
CPC .............. *G06N 10/00* (2019.01); *H03K 3/38* (2013.01); *H03K 19/1952* (2013.01); *G11C 11/44* (2013.01)

(58) Field of Classification Search
None
See application file for complete search history.

(56) References Cited

U.S. PATENT DOCUMENTS

| 6,605,822 B1 | 8/2003 | Blais et al. |
| 6,784,451 B2 | 8/2004 | Amin et al. |

(Continued)

FOREIGN PATENT DOCUMENTS

| WO | 2012/064974 A2 | 5/2012 |
| WO | 2015103372 A1 | 7/2015 |

OTHER PUBLICATIONS

Jones et al., Tunable electromagnetic environment for supercomputing, Jun. 13, 13, Scientific Reports, pp. 1-5 (Year: 2013).*

(Continued)

*Primary Examiner* — David R Vincent
(74) *Attorney, Agent, or Firm* — Cozen O'Connor

(57) ABSTRACT

A quantum processor is operable as a universal adiabatic quantum computing system. The quantum processor includes physical qubits, with at least a first and second communicative coupling available between pairs of qubits via an in-situ tunable superconducting capacitive coupler and an in-situ tunable superconducting inductive coupler, respectively. Tunable couplers provide diagonal and off-diagonal coupling. Compound Josephson junctions (CJJs) of the tunable couplers are responsive to a flux bias to tune a sign and magnitude of a sum of a capacitance of a fixed capacitor and a tunable capacitance which is mediated across a pair of coupling capacitors. The qubits may be hybrid qubits, operable in a flux regime or a charge regime. Qubits may include a pair of CJJs that interrupt a loop of material and which are separated by an island of superconducting material which is voltage biased with respect to a qubit body.

4 Claims, 19 Drawing Sheets

Related U.S. Application Data

(60) Provisional application No. 61/894,267, filed on Oct. 22, 2013.

(51) Int. Cl.
*H03K 19/195* (2006.01)
*G11C 11/44* (2006.01)

(56) References Cited

U.S. PATENT DOCUMENTS

| | | |
|---|---|---|
| 6,791,109 B2 | 9/2004 | Tzalenchuk et al. |
| 6,838,694 B2 | 1/2005 | Esteve et al. |
| 6,897,468 B2 | 5/2005 | Blais et al. |
| 6,936,841 B2 | 8/2005 | Amin et al. |
| 7,002,174 B2 | 2/2006 | Il et al. |
| 7,135,701 B2 | 11/2006 | Amin et al. |
| 7,253,654 B2 | 8/2007 | Amin |
| 7,418,283 B2 | 8/2008 | Amin |
| 7,533,068 B2 | 5/2009 | Maassen van den Brink et al. |
| 7,605,600 B2 | 10/2009 | Harris |
| 7,613,764 B1 | 11/2009 | Hilton et al. |
| 7,843,209 B2 | 11/2010 | Berkley |
| 7,876,248 B2 | 1/2011 | Berkley et al. |
| 8,008,942 B2 | 8/2011 | van den Brink et al. |
| 8,018,244 B2 | 9/2011 | Berkley |
| 8,035,540 B2 | 10/2011 | Berkley et al. |
| 8,098,179 B2 | 1/2012 | Bunyk et al. |
| 8,102,185 B2 | 1/2012 | Johansson et al. |
| 8,164,082 B2 | 4/2012 | Friesen |
| 8,169,231 B2 | 5/2012 | Berkley |
| 8,190,548 B2 | 5/2012 | Choi |
| 8,195,596 B2 | 6/2012 | Rose et al. |
| 8,421,053 B2 | 4/2013 | Bunyk et al. |
| 8,504,497 B2 | 8/2013 | Amin |
| 9,059,674 B2 | 6/2015 | Chow et al. |
| 2002/0121636 A1 | 9/2002 | Amin et al. |
| 2002/0190381 A1 | 12/2002 | Herr et al. |
| 2003/0173498 A1 | 9/2003 | Blais et al. |
| 2003/0207766 A1* | 11/2003 | Esteve ............... G06N 10/00 505/190 |
| 2003/0224753 A1 | 12/2003 | Bremond et al. |
| 2004/0012407 A1 | 1/2004 | Amin et al. |
| 2004/0016918 A1 | 1/2004 | Amin et al. |
| 2004/0077503 A1 | 4/2004 | Blais et al. |
| 2005/0001209 A1 | 1/2005 | Hilton et al. |
| 2005/0062072 A1 | 3/2005 | Yamamoto et al. |
| 2005/0082519 A1 | 4/2005 | Amin et al. |
| 2005/0224784 A1* | 10/2005 | Amin ................... B82Y 10/00 257/14 |
| 2006/0097746 A1 | 5/2006 | Amin |
| 2007/0180586 A1 | 8/2007 | Amin |
| 2012/0094838 A1 | 4/2012 | Bunyk et al. |
| 2012/0278057 A1 | 11/2012 | Biamonte et al. |
| 2017/0256698 A1 | 9/2017 | Nayfeh et al. |

OTHER PUBLICATIONS

Abrams et al., "A quantum algorithm providing exponential speed increase for finding eigenvalues and eigenvectors," arXiv:quant-ph/9807070v1, Jul. 24, 1998, 9 pages.
Abrams et al., "Simulation of Many-Body Fermi Systems on a Universal Quantum Computer," arXiv:quant-ph/9703054, Mar. 28, 1997, 10 pages.
Averin et al., "Variable Electrostatic Transformer: Controllable Coupling of Two Charge Qubits," *Physical Review Letters* 91(5):057003-1-057003-4, 2003.
Berkley et al., "Systems and Methods for Operating a Quantum Processor to Determine Energy Eigenvalues of a Hamiltonian," U.S. Appl. No. 61/832,645, filed Jun. 7, 2013, 51 pages.
Biamonte et al., "Realizable Hamiltonians for universal adiabatic quantum computers," arXiv:0704.1287v2, Jun. 17, 2008, 7 pages.
Bocko et al., "Prospects for Quantum Coherent Computation Using Superconducting Electronics," *IEEE Transactions on Applied Superconductivity* 7(2):3638-3641, Jun. 1997.
Bravyi et al., "The Complexity of Stoquastic Local Hamiltonian Problems," arXiv:quant-ph/0606140v4, Oct. 2, 2007, 21 pages.
Devoret et al., "Superconducting Circuits for Quantum Information: An Outlook," *Science* 339:1169-1174, Mar. 8, 2013.
Devoret et al., "Superconducting Qubits: A Short Review," arXiv:cond-mat/0411174v1, Nov. 7, 2004, 41 pages.
Feynman, "Simulating Physics with Computers," *International Journal of Theoretical Physics* 21(6/7):467-488, 1982, 12 total pages.
Friedman et al., "Aharonov-Casher-Effect Suppression of Macroscopic Tunneling of Magnetic Flux," arXiv:cond-mat/0109544v1, Sep. 28, 2001, 9 pages.
Friedman et al., "Quantum superposition of distinct macroscopic states," *Nature* 406:43-46, Jul. 6, 2000.
Harris et al., "Experimental Demonstration of a Robust and Scalable Flux Qubit," arXiv:0909.4321v1, Sep. 24, 2009, 20 pages.
Harris et al., "Universal Adiabatic Quantum Computing With Superconducting Qubits," U.S. Appl. No. 61/894,267, filed Oct. 22, 2013, 44 pages.
Makhlin et al., "Quantum-state engineering with Josephson-junction devices," *Reviews of Modern Physics* 73(2):357-400, Apr. 2001.
Martinis, "Superconducting phase qubits," *Quantum Inf Process* 8:81-103, 2009.
Mooij et al., "Josephson Persistent-Current Qubit," *Science* 285:1036-1039, Aug. 13, 1999.
Orlando et al., "Superconducting persistent-current qubit," *Physical Review B* 60(22): 15398-15413, Dec. 1, 1999.
Zagoskin et al., "Superconducting Qubits," *La Physique au Canada* 63(4):215-227, 2007.
Blais et al., "Tunable Coupling of Superconducting Qubits," arXiv:cond-mat/0207112v3 [cond-mat.mes-hall], Mar. 18, 2003, 4 pages.
Makhlin et al., "Josephson—Junction Qubits", Fortschritte der Physik 48, pp. 1043-1054, 2000.
Berkley, et al., "Entangled Macroscopic Quantum States in Two Superconducting Qubits", Science, Jun. 6, 2003. https://science.sciencemag.org/content/300/5625/1548.
Blais, et al., Cavity Quantum Electrodynamics for Superconducting Electrical Circuits: An Architecture for Quantum Computation, Physical Review A 69(062320):1-14, 2004.
Choi, M-S., "Geometric Quantum Computation on Solid-State Qubits," arXiv:quant-ph/0111019v4, Sep. 29, 2003, 7 pages.
Clarke, et al., "Superconducting quantum bits," Nature 453:1031-1042, Jun. 19, 2008.
Duty, et al., "Coherent Dynamics of a Josephson Charge Qubit," Physical Review B 69(140503(R)):1-4, 2004.
Hua, et al., "Microstrip Bandpass Filters Using Dual-Mode Resonators with Internal Coupled Lines," Progress in Electromagnetics Research C, 21:99-111, 2011.
Hutter, et al., "Inductively Coupled Charge Qubits with Asymmetric SQUIDs," Jahrestagung der Deutschen Physikalischen Gesellschaft (DPG), 2005, 1 page—abstract only.
Il'ichev, et al., "Radio-Frequency Method for Investigation of Quantum Properties of Superconducting Structures," arXiv:cond-mat/0402559v3, Jun. 23, 2004, 10 pages.
Levitov, et al., "Quantum Spin Chains and Majorana States in Arrays of Coupled Qubits," arXiv:cond-mat/0108266v2 [cond-mat.mes-hall]. Aug. 19, 2001, 7 pages.
Nakamura, et al., "Coherent control of macroscopic quantum states in a single-Cooper-pair-box," Nature 398:786-788, Apr. 29, 1999.
Pashkin, et al., "Quantum Oscillations in Two Coupled Charge Qubits," Nature 421:823-826, Feb. 20, 2003.
Wallquist, et al., "Superconducting Qubit Network with Controllable Nearest-Neighbor Coupling," New Journal of Physics 7(178), 24 pages. 2005.
Wang, et al., "Fast Entanglement of Two Charge-Phase Qubits Through Nonadiabatic Couling to a Large Josephson Junction," Physical Review B 70:224515-1 224515-4, 2004.
Wendin, et al., "Superconducting Quantum Circuits, Qubits and Computing," arXiv:cond-mat/0508729, 2005, 60 pages.

(56) References Cited

OTHER PUBLICATIONS

Wendin, et al., "Superconducting Quantum Circuits, Qubits and Computing," arXiv:cond-mat/0508729v1 [cond-mat.supr-con], Aug. 30, 2005, 60 pages.
Yamamoto, et al., "Demonstration of conditional gate operation using superconducting charge qubits", Nature, Oct. 30, 2003. https://www.nature.com/articles/nature02015.
You, et al., "Controllable Manipulation and Entanglement of Macroscopic Quantum States in Coupled Charge Qubits," Physical Review B 68:024510-1-024510-8, 2003.
You, et al., "Scalable Quantum Computing with Josephson Charge Qubits," Physical Review Letters 89(19): 197902-1-197902-4, 2002.
Zagoskin, et al., "Quantum Two-Level Systems in Josephson Junctions as Naturally Formed Qubits," Physical Review Letters 97:077001-1-077001-4, 2006.
Barends, R., et al., "Coherent Josephson qubit suitable for scalable quantum integrated circuits," arXiv:1304.2322v1 [quant-ph], Apr. 8, 2013, 10 pages.
Hutter, et al., "Tunable Coupling of qubits: nonadiabatic corrections", arXiv:cond-mat/0602086v2, May 12, 2006. https://arxiv.org/abs/cond-mat/0602086.

\* cited by examiner

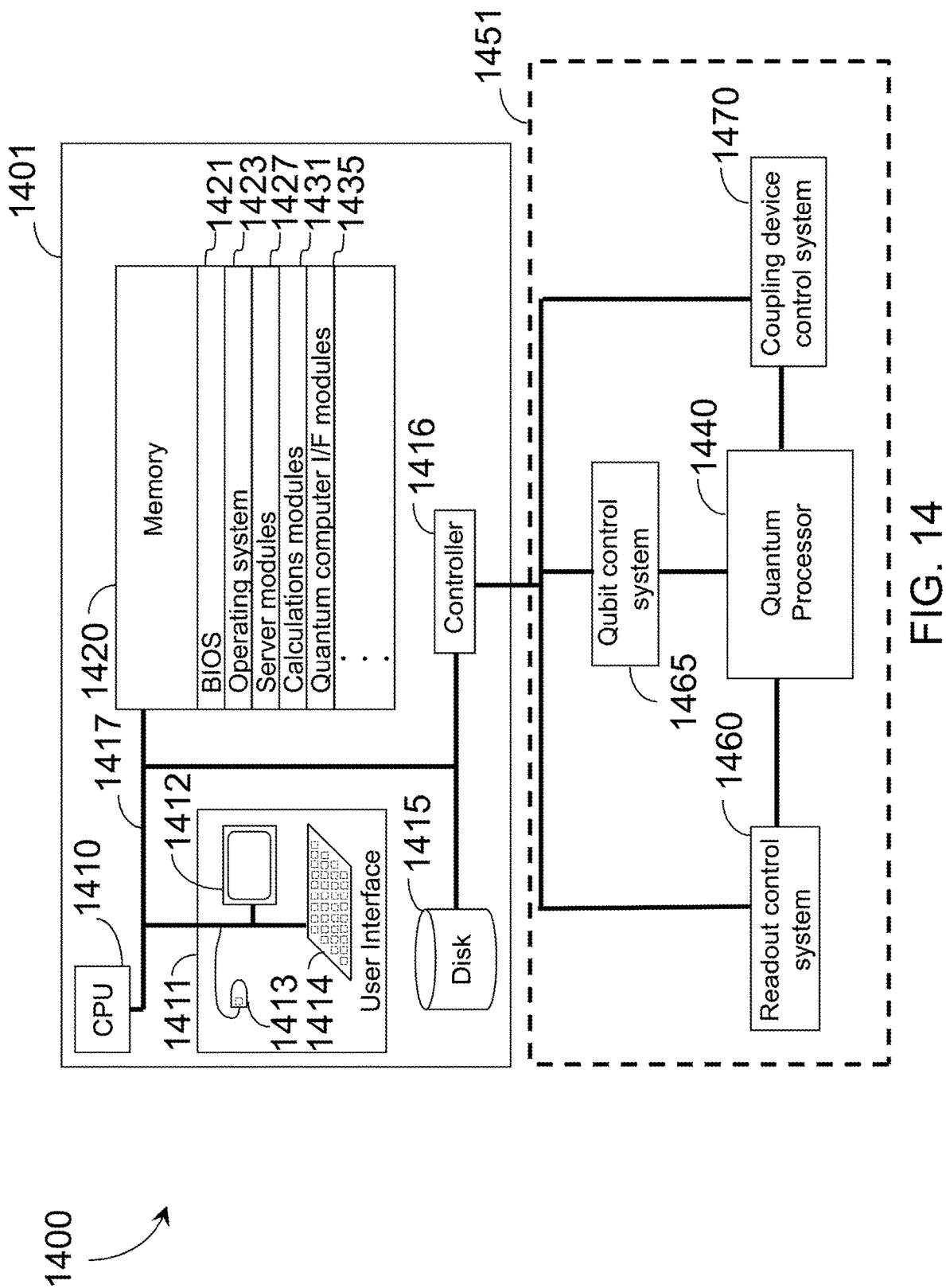

UNIVERSAL ADIABATIC QUANTUM COMPUTING WITH SUPERCONDUCTING QUBITS

BACKGROUND

Field

This disclosure generally relates to designs, layouts, and architectures for quantum processors comprising qubits and techniques for operating the same.

Adiabatic Quantum Computation

Adiabatic quantum computation typically involves evolving a system from a known initial Hamiltonian (the Hamiltonian being an operator whose eigenvalues are the allowed energies of the system) to a final Hamiltonian by gradually changing the Hamiltonian. A simple example of an adiabatic evolution is a linear interpolation between initial Hamiltonian and final Hamiltonian. An example is given by:

$$H_e = (1-s)H_i + sH_f \qquad (1)$$

where $H_i$ is the initial Hamiltonian, $H_f$ is the final Hamiltonian, $H_e$ is the evolution or instantaneous Hamiltonian, and s is an evolution coefficient which controls the rate of evolution. As the system evolves, the evolution coefficient s goes from 0 to 1 such that at the beginning (i.e., s=0) the evolution Hamiltonian $H_e$ is equal to the initial Hamiltonian $H_i$ and at the end (i.e., s=1) the evolution Hamiltonian $H_e$ is equal to the final Hamiltonian $H_f$. Before the evolution begins, the system is typically initialized in a ground state of the initial Hamiltonian $H_i$ and the goal is to evolve the system in such a way that the system ends up in a ground state of the final Hamiltonian $H_f$ at the end of the evolution. If the evolution is too fast, then the system can transition to a higher energy state, such as the first excited state. In the present systems and devices, an "adiabatic" evolution is an evolution that satisfies the adiabatic condition:

$$\dot{s}|\langle 1|dH_e/ds|0\rangle| = \delta g^2(s) \qquad (2)$$

where $\dot{s}$ is the time derivative of s, g(s) is the difference in energy between the ground state and first excited state of the system (also referred to herein as the "gap size") as a function of s, and $\delta$ is a coefficient much less than 1. Generally the initial Hamiltonian $H_i$ and the final Hamiltonian $H_f$ do not commute. That is, $[H_i, H_f] \neq 0$.

The process of changing the Hamiltonian in adiabatic quantum computing may be referred to as evolution. If the rate of change, for example, change of s, is slow enough that the system is always in the instantaneous ground state of the evolution Hamiltonian, then transitions at anti-crossings (i.e., when the gap size is smallest) are avoided. The example of a linear evolution schedule is given above. Other evolution schedules are possible including non-linear, parametric, and the like. Further details on adiabatic quantum computing systems, methods, and apparatus are described in, for example, U.S. Pat. Nos. 7,135,701; and 7,418,283.

Depending on the form of the final Hamiltonian and the way the final results are extracted, one can operate an adiabatic quantum computer in at least three different modes. First, the adiabatic quantum computer can be operated as an adiabatic quantum optimizer to find the ground states of a Hamiltonian. This is also called quantum annealing. Second, it can be operated as a quantum simulator. Third, it can be operated to achieve the results of a gate model quantum algorithm by mapping from the gate model algorithm to an algorithm in the adiabatic quantum computing model.

Quantum Annealing

Quantum annealing is a computation method that may be used to find a low-energy state, typically preferably the ground state, of a system. Similar in concept to classical annealing, the method relies on the underlying principle that natural systems tend towards lower energy states because lower energy states are more stable. However, while classical annealing uses classical thermal fluctuations to guide a system to a low-energy state and ideally its global energy minimum, quantum annealing may use quantum effects, such as quantum tunneling, to reach a global energy minimum more accurately and/or more quickly than classical annealing. In quantum annealing thermal effects and other noise may be present to aid the annealing. However, the final low-energy state may not be the global energy minimum. Adiabatic quantum computation, therefore, may be considered a special case of quantum annealing for which the system, ideally, begins and remains in its ground state throughout an adiabatic evolution. Thus, those of skill in the art will appreciate that quantum annealing systems and methods may generally be implemented on an adiabatic quantum computer. Throughout this specification and the appended claims, any reference to quantum annealing is intended to encompass adiabatic quantum computation unless the context requires otherwise.

Quantum annealing uses quantum mechanics as a source of disorder during the annealing process. The optimization problem is encoded in a Hamiltonian $H_P$, and the algorithm introduces quantum effects by adding a disordering Hamiltonian $H_D$ that does not commute with $H_P$. An example case is:

$$H_E \propto A(t)H_D + B(t)H_P \qquad (3)$$

where A(t) and B(t) are time dependent envelope functions. For example, A(t) changes from a large value to substantially zero during the evolution and $H_E$ may be thought of as an evolution Hamiltonian similar to $H_e$ described in the context of adiabatic quantum computation above. The disorder is slowly removed by removing $H_D$ (i.e., reducing A(t)). Thus, quantum annealing is similar to adiabatic quantum computation in that the system starts with an initial Hamiltonian and evolves through an evolution Hamiltonian to a final "problem" Hamiltonian $H_P$ whose ground state encodes a solution to the problem. If the evolution is slow enough, the system may settle in the global minimum (i.e., the exact solution), or in a local minimum close in energy to the exact solution. The performance of the computation may be assessed via the residual energy (difference from exact solution using the objective function) versus evolution time. The computation time is the time required to generate a residual energy below some acceptable threshold value. In quantum annealing, $H_P$ may encode an optimization problem but the system does not necessarily stay in the ground state at all times. The energy landscape of $H_P$ may be crafted so that its global minimum is the answer to the problem to be solved, and low-lying local minima are good approximations.

Simulating Physics

Adiabatic quantum computation may also be used for quantum simulation. Quantum simulation was the original application of quantum computers, see for example, R. P. Feynman, 1982 "Simulating physics with computers" *International journal of theoretical physics* 21(6), 467. The Hamiltonian of a quantum system is mapped on the Hamiltonian of a multi-qubit system and defines the final or problem Hamiltonian. An initial or disordering Hamiltonian is present per adiabatic computing model. The ground state of the problem Hamilton is then reached via adiabatic evolution. Reading out the final state then provides information about the ground state of the simulated system. A ground-state energy is the lowest eigenvalue of a time-independent Schrödinger equation for the system. The Phase-Estimation Algorithm (PEA) provides the spectrum of the system being simulated via the application of various gates and measurements in accordance with the gate model of quantum computing. See D. S. Abrams and S. Lloyd, 1997 "Simulation of Many-Body Fermi Systems on a Universal Quantum Computer" *Phys. Rev. Lett.* 79, 2586; and D. S. Abrams and S. Lloyd, 1999 "Quantum Algorithm Providing Exponential Speed Increase for Finding Eigenvalues and Eigenvectors" *Phys. Rev. Lett.* 83, 5162.

Universal Quantum Computing

A quantum computational model is universal if it can solve a class of problems known as bounded-error quantum polynomial-time (BQP) problems in polynomial time. Such a universal computer is desirable. A quantum computer including qubits is known to be universal when it can perform single-qubit and non-local many-qubit operations. The operations should be unitary and the many qubit operations entangling. A universal quantum computer (UQC) may also be characterized as a quantum computer able to efficiently simulate any other quantum computer.

Superconducting Qubits

There are types of solid state qubits which are based on circuits of superconducting materials. There are two superconducting effects that underlie how superconducting qubits operate: magnetic flux quantization, and Josephson tunneling.

Flux is quantized via the Aharonov-Bohm effect where electrical charge carriers accrue a topological phase when traversing a conductive loop threaded by a magnetic flux. For superconducting loops, the charge carriers are pairs of electrons called Cooper pairs. For a loop of sufficiently thick superconducting material, quantum mechanics dictates that the Cooper pairs accrue a phase that is an integer multiple of $2\pi$. This, then, constrains the allowed values of magnetic flux threading the loop.

Josephson tunneling is the process by which Cooper pairs cross an interruption, such as an insulating gap of a few nanometers, between two superconducting electrodes. The amount of current is sinusoidally dependent on the phase difference between the two populations of Cooper pairs in the electrodes. These superconducting effects are present in different configurations and give rise to different types of superconducting qubits including flux, phase, charge, and hybrid qubits. These different types of qubits depend on the topology of the loops, placement of the Josephson junctions, and the physical parameters of the parts of the circuit such as inductance, capacitance, and Josephson junction critical current.

Quantum Processor

A quantum processor may take the form of a superconducting quantum processor. A superconducting quantum processor may include a number of qubits and associated local bias devices, for instance two or more superconducting qubits. A superconducting quantum processor may also employ coupling devices (i.e., "couplers") providing communicative coupling between qubits. A qubit and a coupler resemble each other but differ in physical parameters. One difference is the screening parameter, $\beta$. Consider an rf-SQUID, which includes a superconducting loop interrupted by Josephson junction. The screening parameter $\beta$ is defined as the ratio of the geometrical inductance of the loop to the so called Josephson inductance of the junction.

The screening parameter $\beta$ is defined as $2\pi L I_C/\Phi_0$. That is, $\beta$ is proportional to the product of inductance and critical current. A design with lower values of $\beta$, below about 1, behaves more like an inductive loop whose magnetic susceptibility is altered by the presence of the Josephson junction. This is a monostable device. A design with higher values of $\beta$ is more dominated by the Josephson junctions and produces a multi-stable behavior, such as bistable behavior. Flux qubits are typically designed to be bistable wherein there are degenerate ground state configurations for the superconducting current flowing around the loop. For SQUIDs with sufficiently low capacitance, quantum tunneling lifts the degeneracy of the ground state. Couplers are typically designed to be monostable, such that there is a single ground state configuration of the superconducting current flowing around the loop.

Both qubits and couplers can have more devices associated with them. Further details and embodiments of exemplary quantum processors that may be used in conjunction with the present systems and devices are described in, for example, U.S. Pat. Nos. 7,533,068; 8,008,942; 8,195,596; 8,190,548; and 8,421,053.

Most efforts in the field of quantum computing are devoted to the development of hardware that supports the universal quantum computing paradigm known as gate model quantum computation (GMQC). While GMQC has proved theoretically appealing, it has been difficult to realize in practice. An alternative quantum computing paradigm that has received appreciable experimental effort to date is adiabatic quantum computation (AQC).

Existing approaches to AQC include hardware that implements a particular AQC algorithm known as adiabatic quantum optimization (AQO). While AQO cannot provide the full functionality of what is deemed to be a universal quantum computer, it has nonetheless provided a valuable testing ground for the development of a quantum computing technology using currently available device fabrication techniques.

The quantum processor described herein takes what has been learned from building an AQO technology and applies that knowledge to the development of a universal quantum computer. The computational equivalence of AQC to GMQC has been shown in the art, and publications exist showing how to map exemplary algorithms from the gate model to the adiabatic quantum computing model.

SUMMARY OF THE INVENTION

A quantum processor may be summarized as including: at least a first pair of qubits; a first in-situ tunable superconducting capacitive coupler having a tunable capacitance, the first in-situ tunable superconducting capacitive coupler positioned to selectively provide a first communicative coupling between the qubits of the first pair of qubits; and a first in-situ tunable superconducting inductive coupler having a tunable inductance, the first in-situ tunable superconducting inductive coupler positioned to selectively provide a second communicative coupling between the qubits of the first pair of qubits.

Each of the qubits of the first pair of qubits may be a respective hybrid qubit which is operable in a flux regime or in a charge regime based on a ratio of Josephson energy to charging energy of the hybrid qubit.

The quantum processor may further include at least one readout device positioned and operable to selectively determine a state of at least one of the hybrid qubits.

Each of the qubits of the first pair of qubits may include: a qubit body, the qubit body comprising a loop of material that is superconductive below a critical temperature; and a pair of compound Josephson junctions that interrupt the loop of material, the pair of compound Josephson junctions separated by an island of superconducting material, and the island may be voltage biased with respect to the qubit body. The first in-situ tunable superconducting capacitive coupler may be located between the island of each of the qubits of the first pair of qubits, and the first in-situ tunable superconducting inductive coupler may be located between the qubit body of each of the qubits of the first pair of qubits. One of the first in-situ tunable superconducting capacitive coupler or the first in-situ tunable superconducting inductive coupler may provide a diagonal coupling in the computational basis and the other one of the first in-situ tunable superconducting capacitive coupler and the first in-situ tunable superconducting inductive coupler may provide an off-diagonal coupling in the computational basis. Each of the compound Josephson junctions may be inductively coupled to a bias line, the bias line shared by at least one of the qubits of the pair of qubits. One of the first in-situ tunable superconducting capacitive coupler or the first in-situ tunable superconducting inductive coupler may provide a diagonal coupling in the computational basis and the other one of the first in-situ tunable superconducting capacitive coupler and the first in-situ tunable superconducting inductive coupler may provide an off-diagonal coupling in the computational basis. The first in-situ tunable superconducting capacitive coupler may provide an off-diagonal coupling in the computational basis. Each of the qubits of the first pair of qubits may be communicatively coupleable to at least three qubits in addition to the qubits of the first pair of qubits. The quantum processor may be operable as a universal adiabatic quantum computing system.

A tunable superconducting capacitive coupler to communicatively couple a pair of qubits may be summarized as including: a pair of coupling capacitors in series with one another; a fixed capacitor in parallel with the pair of coupling capacitors, and a compound Josephson junction connected to a node between the coupling capacitors of the pair of coupling capacitors, the compound Josephson junction responsive to a flux bias to tune a sign and a magnitude of a sum of a capacitance of the fixed capacitor and a tunable capacitance which is mediated across the pair of coupling capacitors.

The tunable superconducting capacitive coupler may further include a node which connects to a voltage source to provide a gate voltage to the compound Josephson junction.

The tunable superconducting capacitive coupler may further include a node which connects to a voltage rail to provide a gate voltage to the compound Josephson junction of the tunable superconducting capacitive coupler and to one or more additional tunable superconducting capacitive couplers.

The compound Josephson junction may be directly connected to the node between the coupling capacitors of the pair of coupling capacitances.

A method for reading a respective final state of one or more qubits in a quantum processor may be summarized as including: setting a bias line to a dc level in operation of the one or more qubits during adiabatic quantum computing (AQC) evolution, the bias line inductively coupled to at least one compound Josephson junction; applying a step to the bias line; passing the respective final state of the one or more qubits through a scalable shift register; and reading the respective final state of the one or more qubits via one or more readout devices.

Passing the respective final state of the one or more qubits through a scalable shift register may include passing the respective final state of the one or more qubits through a quantum flux parametron shift register.

A non-transitory computer-readable storage medium may be summarized as containing at least one of processor-executable instructions or data, which when executed by at least one processor cause the at least one processor to: receive a final Hamiltonian including tunable coupling terms having a number of diagonal components and a number of off-diagonal components in the computational basis; initialize a quantum processor to a first initial state; cause the quantum processor to evolve for a time period from the first initial state toward the final Hamiltonian; and read out a final state.

The processor-executable instructions when executed may further cause the at least one processor to: receive a computational problem; and convert the computational problem into the final Hamiltonian. The processor-executable instructions when executed may further cause the at least one processor to: receive a description of a system to simulate; and convert the description of the system to simulate into the final Hamiltonian. The processor-executable instructions when executed may further cause the at least one processor to embed the final Hamiltonian in the quantum processor.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

FIG. 14 illustrates computing system including a digital computer coupled to a quantum computer in accordance with the present systems, methods and devices.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with quantum processors, qubits, couplers, controller, readout devices and/or interfaces have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

The various embodiments described herein provide techniques to advance universal quantum computing in systems previously associated with adiabatic quantum computing and/or quantum annealing. Previous work to map gate model approaches to AQC approaches focused on existence rather than practical implementation of such mappings.

Figure 1:
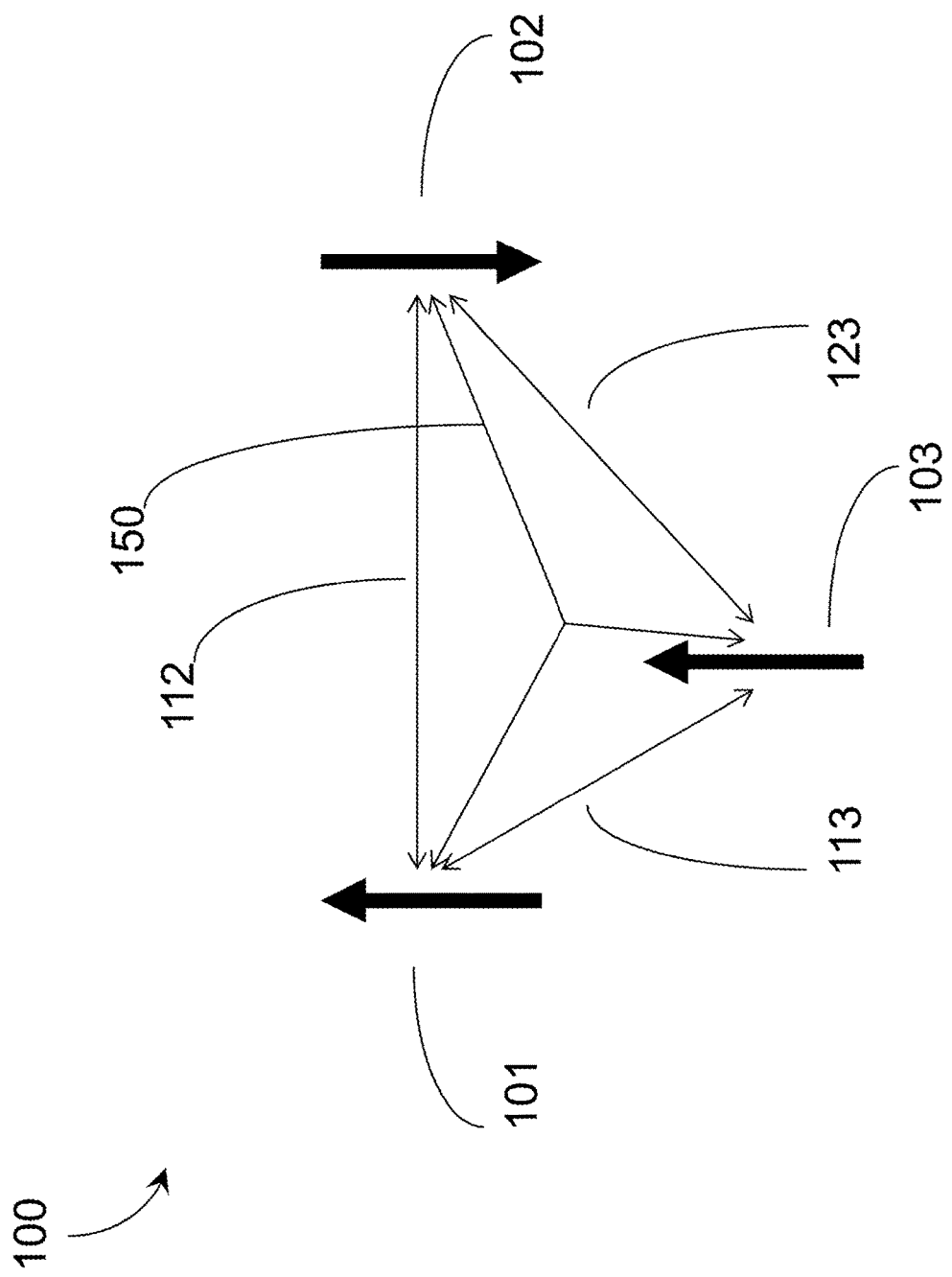
FIG. 1 illustrates a plurality of two-state particles that may tunnel between states and may be coupled in a variety of ways.

FIG. 1 illustrates a plurality of two-state particles that may tunnel between states and may be coupled in a variety of ways. In particular, FIG. 1 shows a set of half integer spin particles in a magnetic field (not shown in FIG. 1). Many physical systems can be modeled as half integer spin particles. In some instances, the magnetic field can be a global magnetic field. In other instances, the magnetic field can comprise one or more local magnetic fields. The spins can be Ising, XY, Heisenberg or other suitable spins.

Coupled system 100 shows the particles 101, 102, and 103. Particle 102 is shown in the down state. Each particle can undergo single particle operations corresponding to the Pauli matrices $\{I, \sigma_i^x, \sigma_i^y, \sigma_i^z\}$ where the subscript is the qubit index. Between the particles are set of 2-local interactions 112, 113, and 123. Also shown is a 3-local interaction 150. However, most interactions in nature are deemed to be 2-local and most implementations of qubits have 2-local (pairwise) interactions as their multi-qubit interactions.

A Universal Quantum Computer (UQC) is a quantum computer which is capable of efficiently simulating any other quantum computer. In some embodiments, a Universal Adiabatic Quantum Computer (UAQC) would be able to simulate any quantum computer via adiabatic quantum computation and/or via quantum annealing. In some embodiments, a UAQC would be able to simulate a physical quantum system via adiabatic quantum computation and/or via quantum annealing.

It has been established that local lattice spin Hamiltonians can be used for universal adiabatic quantum computation. However, the 2-local model Hamiltonians used are general and hence do not limit the types of interactions required between spins to be known interactions that can be realized in a quantum processor. The 2-local Ising model with 1-local transverse field has been realized using different of technologies.

This quantum spin model is thought unlikely to be universal for adiabatic quantum computation. See discussion in S. Bravyi et al., 2006 arXiv:quant-ph/0606140v4 or *Quant. Inf. Comp.* 8, 0361(2008). However, it has been shown that adiabatic quantum computation can be rendered universal and belongs to the Quantum Merlin Arthur complexity class, a quantum analog of the NP complexity class, by having tunable 2-local diagonal and off-diagonal couplings in addition to tunable 1-local diagonal and off-diagonal biases.

Diagonal and off-diagonal terms can be defined with reference to the computational basis. The state of a qubit can be one of two basis states or a linear superposition of the two basis states. The two states form a computational basis.

The Hamiltonian that defines a universal quantum computer can be expressed in different forms. Limiting the conventional formulations including only 2-local interactions, the most compact physically realizable universal Hamiltonians are equivalent to:

$$H_{U1} \propto \sum_{i=1}^{N}(d_i\sigma_i^x + h_i\sigma_i^z) + \sum_{i,j>i}^{N}(J_{ij}^z\sigma_i^z\sigma_j^z + J_{ij}^x\sigma_i^x\sigma_j^x) \qquad (4)$$

$$H_{U2} \propto \sum_{i=1}^{N}(d_i\sigma_i^x + h_i\sigma_i^z) + \sum_{i,j>i}^{N}(J_{ij}^{zx}\sigma_i^z\sigma_j^x + J_{ij}^{xz}\sigma_i^x\sigma_j^z) \qquad (5)$$

See J. D. Biamonte and P. Love, 2008 "Realizable Hamiltonians for Universal Adiabatic Quantum Computers" *Phys. Rev. A* 78, 012352. These Hamiltonians provide for universal quantum computing when the signs and magnitudes of terms $d_i$, $h_i$, $J_{ij}^x$, $J_{ij}^z$, $J_{ij}^{zx}$ and $J_{ij}^{xz}$ are tunable. However, it is believed that it may be possible Equation (4) provides a universal Hamiltonian without a sign tunable off-diagonal term $d_i$. It is also believed that for some Hamiltonians, all terms in the Hamiltonian need not be sign and magnitude tunable for the Hamiltonian to support universal adiabatic quantum computing. For example, a universal Hamiltonian could be as follows or the equivalent:

$$H_{U3} \propto \sum_{i=1}^{N}(d_i\sigma_i^x + h_i\sigma_i^z) + \sum_{i,j>i}^{N}(J_{ij}^y\sigma_i^y\sigma_j^y + J_{ij}^z\sigma_i^z\sigma_j^z) \qquad (6)$$

This Hamiltonian provides for universal quantum computing when the signs and magnitude of terms $h_i$, $J_{ij}^y$, and $J_{ij}^z$ are tunable.

In accordance with some embodiments of the present systems, methods and devices, a quantum processor may be designed to perform adiabatic quantum computation and/or quantum annealing. An evolution Hamiltonian is proportional to the sum of a first term proportional to the problem Hamiltonian and a second term proportional to the disordering Hamiltonian. As previously discussed, a typical evolution may be represented by Equation (7):

$$H_E \propto A(t)H_D + B(t)H_P \qquad (7)$$

where $H_P$ is the problem Hamiltonian, disordering Hamiltonian is $H_D$, $H_E$ is the evolution or instantaneous Hamiltonian, and A(t) and B(t) are examples of evolution coefficients which control the rate of evolution. In general, evolution coefficients vary from 0 to 1. In some embodiments, a time varying evolution coefficient is placed on the problem Hamiltonian. A common disordering Hamiltonian is shown in Equation (8):

$$H_D \propto -\frac{1}{2}\sum_{i=1}^{N}\Delta_i\sigma_i^x \qquad (8)$$

where N represents the number of qubits, $\sigma^x$ is the Pauli x-matrix for the $i^{th}$ qubit and $\Delta_i$ is the single qubit tunnel splitting induced in the $i^{th}$ qubit. Here, the $\sigma_i^x$ terms are examples of off-diagonal terms. An example problem Hamiltonian includes a first component proportional to diagonal single qubit terms and a second component proportional to diagonal multi-qubit terms. The problem Hamiltonian, for example, may be of the form:

$$H_P \propto -\frac{\varepsilon}{2}\left[\sum_{i=1}^{N}h_i\sigma_i^z + \sum_{j>i}^{N}J_{ij}\sigma_i^z\sigma_j^z\right] \qquad (9)$$

where N represents the number of qubits, $\sigma_i^z$ is the Pauli z-matrix for the $i^{th}$ qubit, $h_i$ and $J_{i,j}$ are dimensionless local fields communicatively coupled into each qubit, and ε is some characteristic energy scale for $H_P$. Here, the $\sigma_i^z$ and $\sigma_i^z\sigma_j^z$ terms are examples of "diagonal" terms. The former is a single qubit term and the latter a two qubit term. Note that the product of matrices (such as the Pauli x-matrix and Pauli z-matrix) is a tensor product. Throughout this specification, the terms "problem Hamiltonian" and "final Hamiltonian" are used interchangeably.

Hamiltonians such as $H_D$ and $H_P$ in Equations (8) and (9), respectively, may be physically realized in a variety of different ways. A particular example is realized by an implementation of superconducting qubits.

Figure 2:
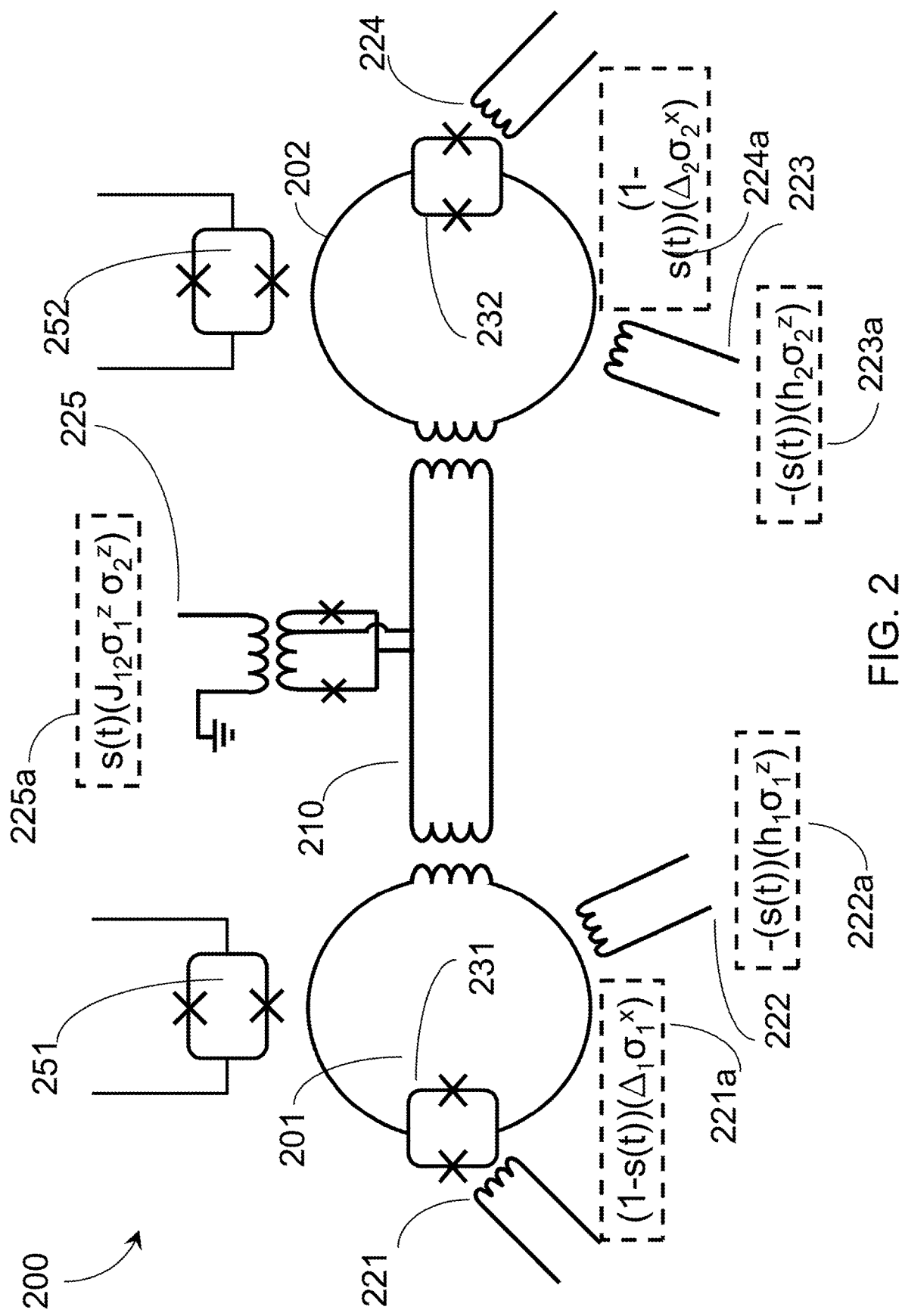
FIG. 2 illustrates a portion of an exemplary superconducting quantum processor designed for adiabatic quantum computing (and/or quantum annealing).

FIG. 2 is a schematic diagram of a portion of an exemplary superconducting quantum processor 200 designed for quantum annealing (and/or adiabatic quantum computing). Components from the quantum processor 200 can be used to implement the present systems and devices. The portion of superconducting quantum processor 200 shown in FIG. 2 includes two superconducting qubits 201, and 202. Also shown is a tunable ZZ-coupling (diagonal coupling) 210 therebetween qubits 201 and 202 (i.e., providing 2-local interaction). While the portion of quantum processor 200 shown in FIG. 2 includes only two qubits 201, 202 and one coupler 210, those of skill in the art will appreciate that quantum processor 200 may include any number of qubits and any number of coupling devices coupling information therebetween.

The portion of quantum processor 200 shown in FIG. 2 may be implemented to physically realize adiabatic quantum computing and/or quantum annealing. Quantum processor 200 includes a plurality of interfaces 221-225 that are used to configure and control the state of quantum processor 200. Each of interfaces 221-225 may be realized by a respective inductive coupling structure, as illustrated, as part of a programming subsystem and/or an evolution subsystem. Such a programming subsystem and/or evolution subsystem may be separate from quantum processor 200, or it may be included locally (i.e., on-chip with quantum processor 200) as described in, for example, U.S. Pat. Nos. 7,876,248; and 8,035,540.

In the operation of quantum processor 200, interfaces 221 and 224 may each be used to couple a flux signal into a respective compound Josephson junction 231 and 232 of qubits 201 and 202, thereby controlling the $\Delta_i$ terms in the system Hamiltonian. This communicative coupling controls the off-diagonal $\sigma^x$ terms of the Hamiltonian described by Equation (8). Similarly, interfaces 222 and 223 may each be used to apply a flux signal into a respective qubit loop of qubits 201 and 202, thereby realizing the $h_i$ terms in the system Hamiltonian. This communicative coupling provides the diagonal $\sigma^z$ terms of Equation (9). Furthermore, interface 225 may be used to couple a flux signal into coupler 210, thereby realizing the $J_{ij}$ term(s) in the system Hamiltonian. This communicative coupling provides the diagonal $\sigma_i^z\sigma_j^z$ terms of Equation (9). In FIG. 2, the contribution of each of interfaces 221-225 to the system Hamiltonian is indicated in boxes 221*a*-225*a*, respectively. As shown, in the example of FIG. 2, the boxes 221*a*-225*a* are elements of a time-varying Hamiltonian for adiabatic quantum computing and/or quantum annealing.

Throughout this specification and the appended claims, the term "quantum processor" is used to generally describe a collection of physical qubits (e.g., qubits 201 and 202) and physical couplers (e.g., coupler 210). The physical qubits 201 and 202 and the physical couplers 210 are referred to as the "programmable elements" of the quantum processor 200 and their corresponding parameters (e.g., the qubit $h_i$ values and the coupler $J_{ij}$ values) are referred to as the "programmable parameters" of the quantum processor. In the context of a quantum processor, the term "programming subsystem" is used to generally describe the interfaces (e.g., "programming interfaces" 222, 223, and 225) used to control the programmable parameters (e.g., the $h_i$ and $J_{ij}$ terms) of the quantum processor 200 and other associated control circuitry and/or instructions. As previously described, the programming interfaces of the programming subsystem may communicate with other subsystems which may be separate from the quantum processor or may be included locally on the processor. As described in more detail later, the programming subsystem may receive programming instructions in a machine language of the quantum processor and execute the programming instructions to program the programmable elements in accordance with the programming instructions.

Similarly, in the context of a quantum processor, the term "evolution subsystem" is used to generally describe the interfaces (e.g., "evolution interfaces" 221 and 224) used to evolve the programmable elements of the quantum processor 200 and other associated control circuitry and/or instructions. For example, the evolution subsystem may include annealing signal lines and their corresponding interfaces (221, 224) to the qubits (201, 202).

Quantum processor 200 also includes readout devices 251 and 252, where readout device 251 is associated with qubit 201 and readout device 252 is associated with qubit 202. In the embodiment shown in FIG. 2, each of readout devices 251 and 252 includes a DC-SQUID inductively coupled to the corresponding qubit 201 and 202. In the context of quantum processor 200, the term "readout subsystem" is used to generally describe the readout devices 251, 252 used to read out the final states of the qubits (e.g., qubits 201 and 202) in the quantum processor to produce a bit string. The readout subsystem may also include other elements, such as routing circuitry (e.g., latching elements, a shift register, or a multiplexer circuit) and/or may be arranged in alternative configurations (e.g., an XY-addressable array, an XYZ-addressable array, etc.). Qubit readout may also be performed using alternative circuits, such as that described in PCT Patent Publication WO2012064974.

While FIG. 2 illustrates only two physical qubits 201, 202, one coupler 210, and two readout devices 251, 252, a quantum processor (e.g., processor 200) may employ any number of qubits, couplers, and/or readout devices, including a larger number (e.g., hundreds, thousands or more) of qubits, couplers and/or readout devices. The application of the teachings herein to processors with a different (e.g., larger) number of computational components should be readily apparent to those of ordinary skill in the art based on the teachings herein.

Examples of superconducting qubits include superconducting flux qubits, superconducting charge qubits, and the like. In a superconducting flux qubit, the Josephson energy dominates or is equal to the charging energy. In a charge qubit, it is the reverse. Examples of flux qubits that may be used include rf-SQUIDs, which include a superconducting loop interrupted by one Josephson junction, persistent current qubits, which include a superconducting loop interrupted by three Josephson junctions, and the like. See, examples of rf-SQUID qubits in Bocko, et al., 1997 IEEE Trans. on Appl. Supercond. 7, 3638; Friedman, et al., 2000, Nature 406, 43; and Harris et al., 2010, Phys. Rev. B 81, 134510; or persistent current qubits, Mooij et al., 1999, Science 285, 1036; and Orlando et al., 1999, Phys. Rev. B 60, 15398. In addition, hybrid charge-phase qubits, where the energies are equal, may also be used. Further details of superconducting qubits may be found in Makhlin, et al., 2001, Rev. Mod. Phys. 73, 357; Devoret et al., 2004, arXiv:cond-mat/0411174; Zagoskin and Blais, 2007, Physics in Canada 63, 215; Clarke and Wilhelm, 2008, Nature 453, 1031; Martinis, 2009, Quantum Inf. Process. 8, 81; and Devoret and Schoelkopf, 2013, Science 339, 1169. In some embodiments, the qubit is controlled by on chip circuitry. Examples of on-chip control circuitry can be found in U.S. Pat. Nos. 7,876,248; 7,843,209; 8,018,244; 8,098,179; 8,169,231; and U.S. Patent Publication 2012-0094838.

A hybrid qubit, which is a component of the quantum processor described herein, is described in detail with reference to FIGS. 8 and 10. An in-situ tunable superconducting capacitive coupler, which is also a component of the quantum processor described herein, is described in detail with reference to FIGS. 5C and 5D.

Figure 3:
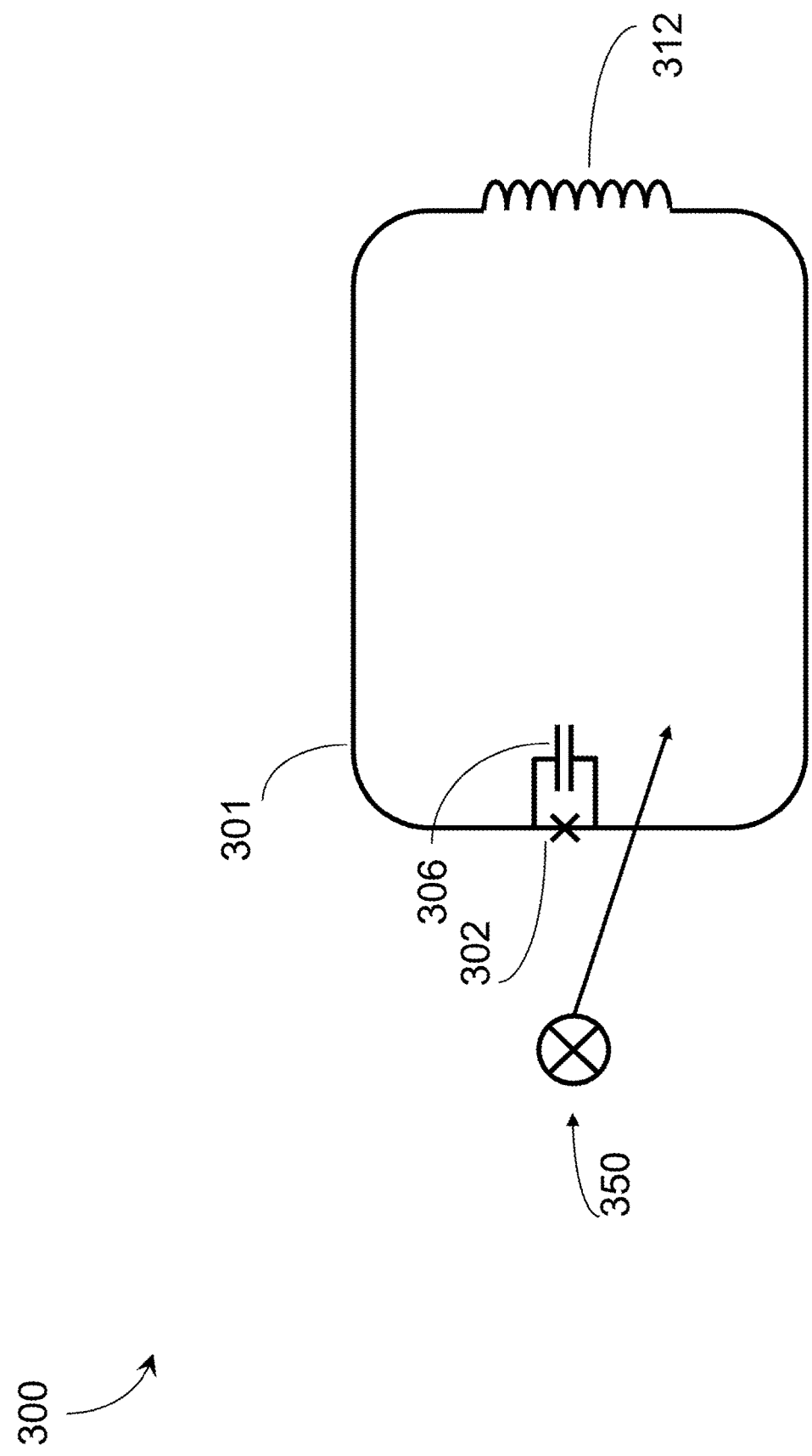
FIG. 3 illustrates a flux qubit.

FIG. 3 illustrates a flux qubit, and FIGS. 4, 5A, 5B, 6 and 7 illustrate other couplers. While not included as components in the embodiment of a quantum computer system configurable as a universal adiabatic quantum computer illustrated in FIG. 9B, for example, such arrangements of other qubits and couplers can convey a benefit.

FIG. 3 illustrates a flux qubit in a schematic form. A qubit 300 includes a loop 301 of superconducting metal interrupted by a Josephson junction 302. The Josephson junction 302 includes an intrinsic capacitance 306 shown schematically in parallel to the Josephson junction. In some implementations, the Josephson junction 302 can be a compound Josephson junction. The loop 301 includes an inductor that provides an inductance schematically shown at 312.

The qubit 300 can be threaded by a magnetic flux 350. The magnetic flux 350 is the component of magnetic flux orthogonal to the plane of the qubit 300. The magnetic flux 350 can be orthogonal to the plane of qubit 300 and directed either into the plane of the qubit 300, or out of the plane of the qubit 300. For example, the magnetic flux 350 is shown in FIG. 3 as orthogonal to the plane of qubit 300 and directed into the plane (as indicated according to convention by a "cross"). There can also be a component of magnetic flux parallel to the plane of the qubit 300 (not shown in FIG. 3).

The magnetic flux 350 can enter or leave the loop 301 via a weak link in the loop 301 such as the Josephson junction 302. The magnetic flux 350 corresponds to the states in the diagonal basis of the qubit 300.

Figure 4:
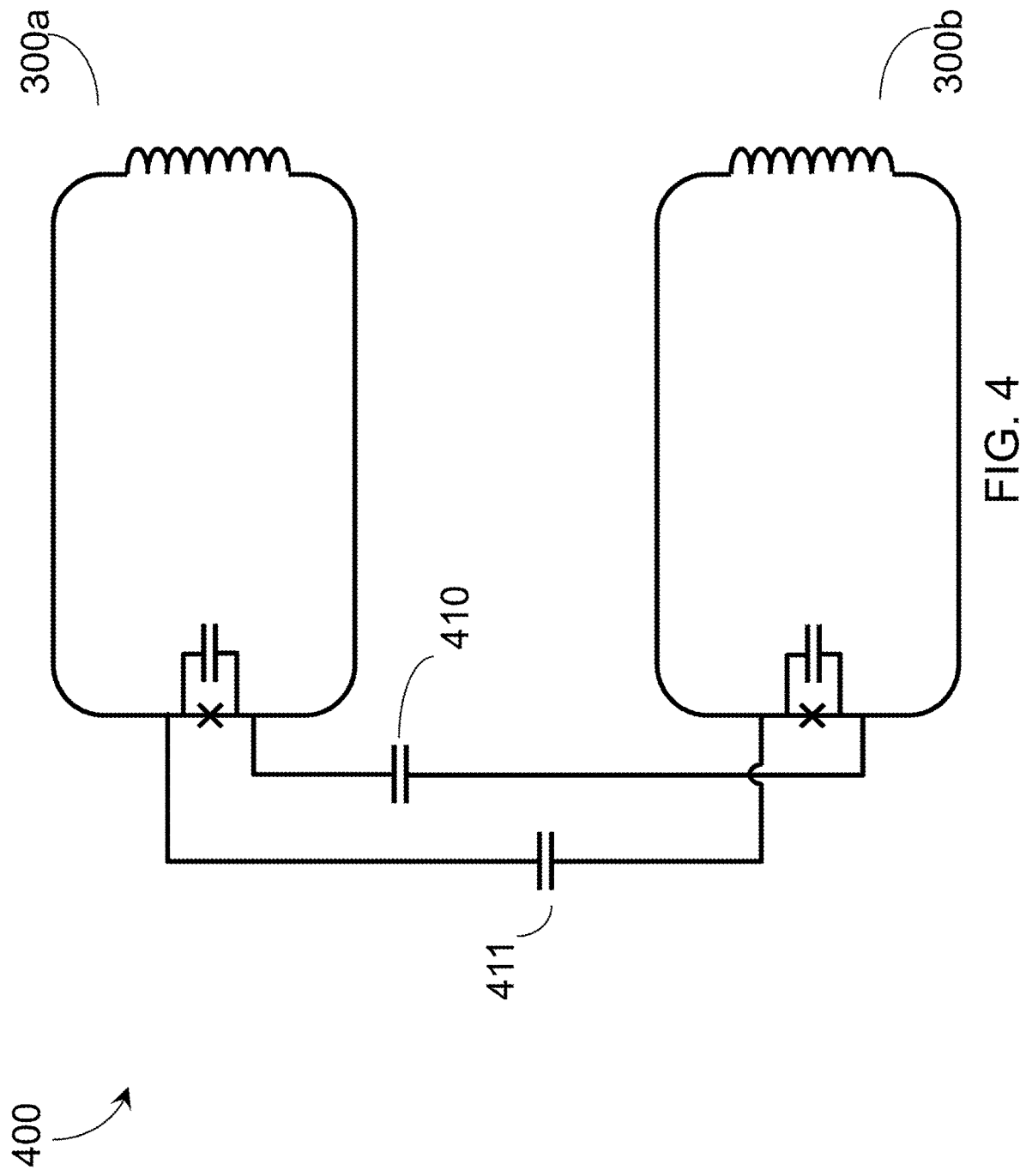
FIG. 4 illustrates a pair of coupled flux qubits with capacitive coupling in accordance with the present systems, methods and devices.

FIG. 4 schematically illustrates a pair of coupled qubits 400, comprising flux qubits 300a and 300b. Coupled qubits 400 further comprise charge-charge coupling according to at least one embodiment. Qubit 300a is coupled to qubit 300b via a first capacitance 410 and a second capacitance 411. As shown, first capacitance 410 defines a path between qubits 300a and 300b and provides a coupling between the charge on the lower half of qubit 300a and the charge on the lower half of qubit 300b. As shown, second capacitance 411 provides a coupling between the upper half of qubit 300a and the upper half of qubit 300b.

The coupling shown in FIG. 4 leads to a crossing of wires. One cannot unfold the crossing without reorienting one of the flux qubits (300a or 300b) and its associated magnetic flux. Re-orienting a qubit would affect the state of the qubits and the nature of the coupling between the qubits.

In some embodiments, one of capacitances 410 and 411 is not supplied via a discrete capacitor but rather supplied via a capacitor formed by other elements (e.g., circuit trace, dielectric substrate, ground plane) as a mutual or parasitic capacitive coupling, e.g., via a ground plane in the quantum processor.

For the sake of clarity only a pair of qubits is shown in FIG. 4 but a person of skill in the art will appreciate any array or tiling of these qubits can be made. In some embodiments, the capacitances between qubits (such as 410 and 411) can be implemented using an insulative or dielectric gap between wiring layers on a quantum processor, for example. The capacitance can be found in a Josephson junction. The coupling between qubits provides for an off-diagonal coupling. Specifically, the off-diagonal coupling comprises a non-tunable YY-coupling therebetween qubits 300a and 300b.

D. Averin and C. Bruder, 2003 "Variable electrostatic transformer: controllable coupling of two charge qubits" Phys. Rev. Lett. 91, 057003, preprint at arXiv:cond-mat/0304166, describe a tunable electrostatic transformer providing capacitive coupling between two charge qubits. The Averin and Bruder coupling comprises a single Josephson junction and two coupling capacitors.

Figure 5A:
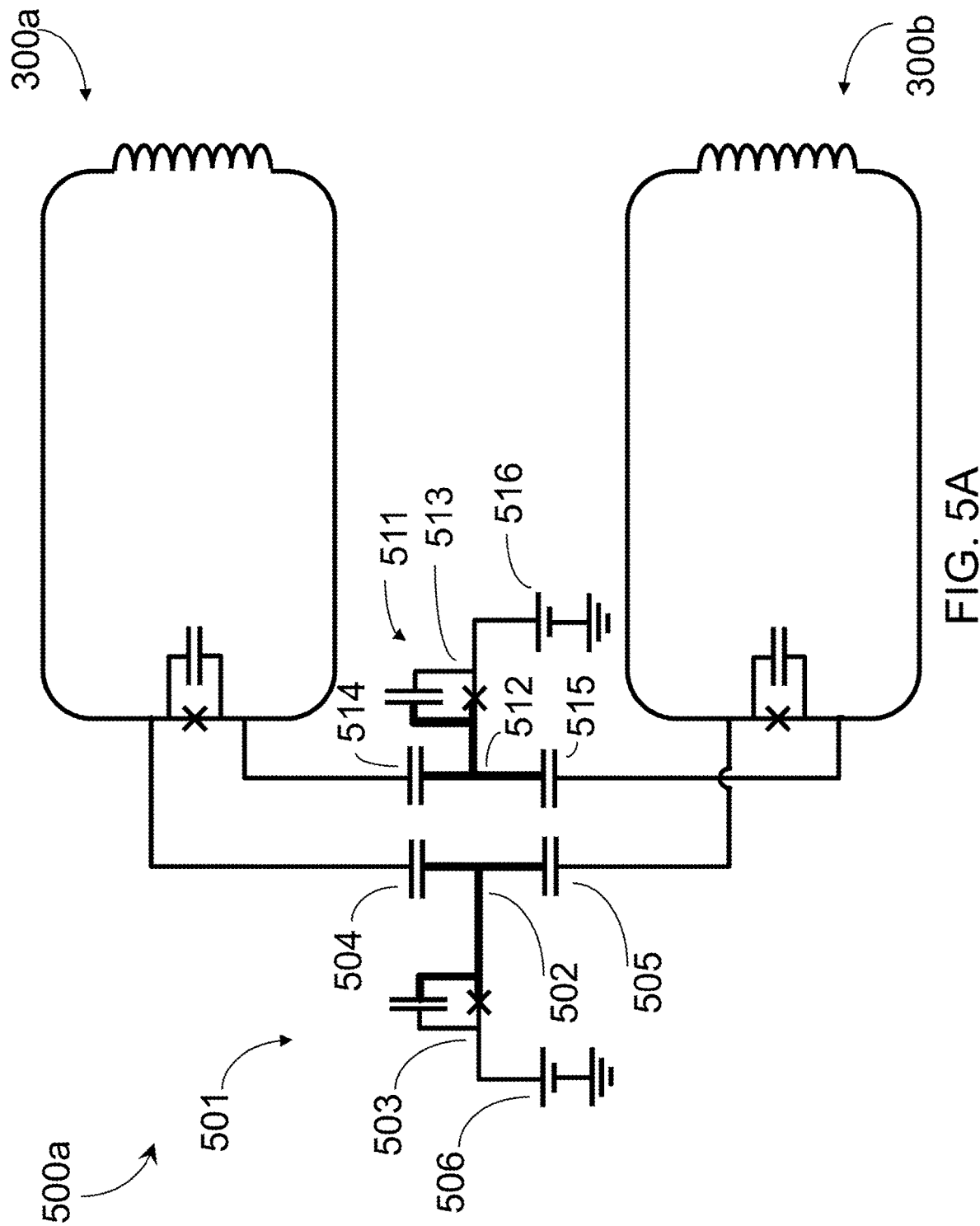
FIG. 5A illustrates a configuration of a pair of coupled flux qubits with variable capacitive coupling.

FIG. 5A illustrates a configuration 500a of a pair of coupled qubits with variable capacitive coupling. The configuration 500a is similar in some respects to the coupled qubits in FIG. 4. A pair of qubits 300a and 300b are capacitively coupled with a crossing of the wires. A first capacitance in the coupling is made tunable by the addition of a first variable electrostatic transformer 501. A second capacitance in the coupling can be made tunable by a second variable electrostatic transformer 511. The variable electrostatic transformer 501 comprises an island 502 of superconducting metal having boundaries defined by a Josephson junction 503, a first capacitor 504 and a second capacitor 505. The island 502 is indicated in FIG. 5A by the thicker lines connecting the Josephson junction 503, the first capacitor 504 and the second capacitor 505. The variable electrostatic transformer 501 further comprises the Josephson junction 503 and a voltage source 506. By modulating the voltage applied to the Josephson junction 503, the net capacitance across the first capacitor 504 and the second capacitor 505 can be changed in sign and magnitude.

Similarly to the first variable electrostatic transformer 501, the second variable electrostatic transformer 511 comprises an island 512 of superconducting metal having boundaries defined by a Josephson junction 513, a first capacitor 514 and a second capacitor 515. The variable electrostatic transformer 511 further comprises the Josephson junction 513 and a voltage source 516. The capacitive coupling between the qubits 300a and 300b can be tuned by modulating the voltage applied to the Josephson junction 513.

The capacitance in the coupling can be made tunable by the addition of a variable electrostatic transformer controlled by a DC-SQUID.

Figure 5B:
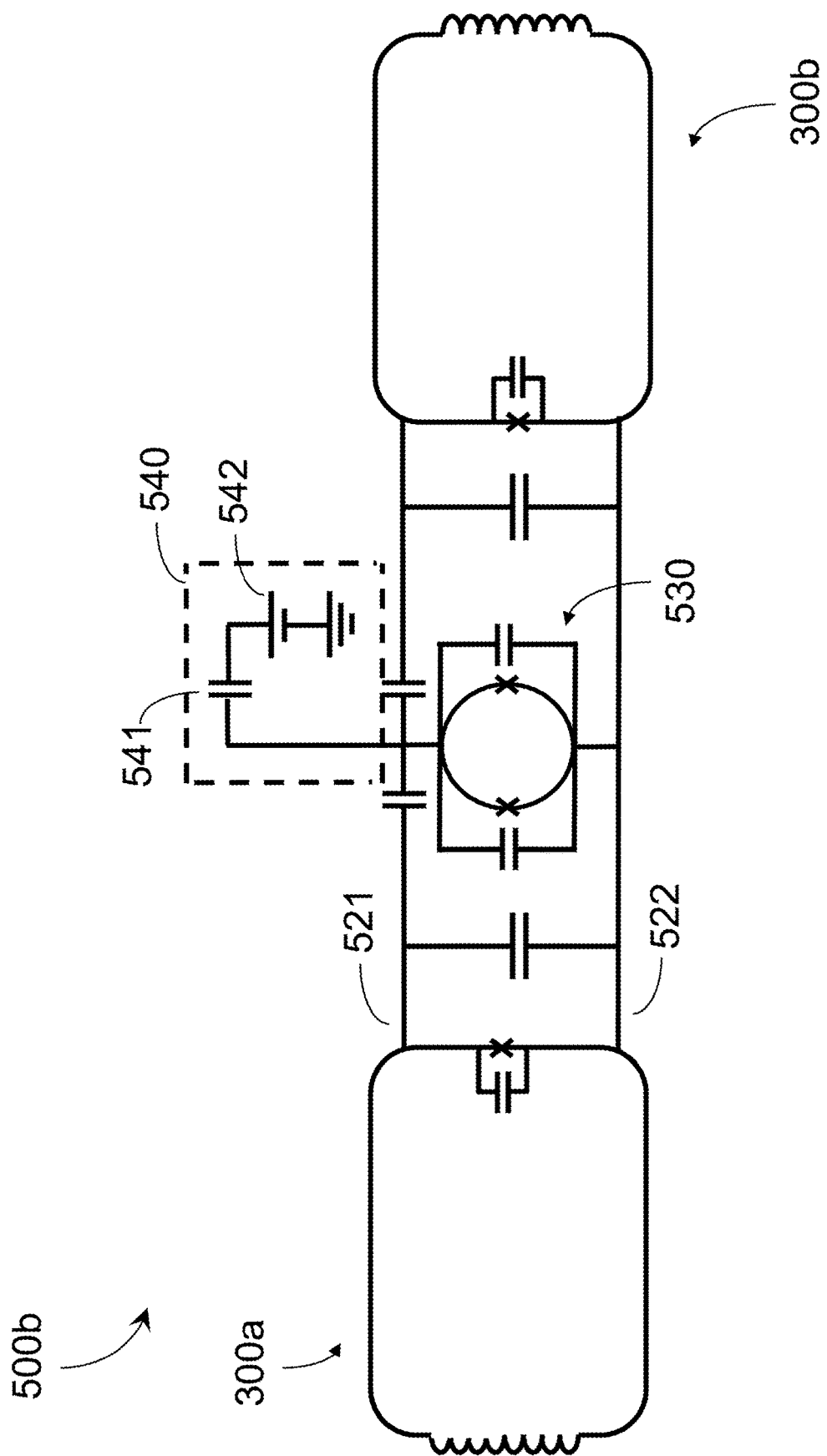
FIG. 5B illustrates a configuration of a pair of coupled qubits with variable capacitive coupling made tunable by the addition of a variable electrostatic transformer controlled by a DC-SQUID.

FIG. 5B illustrates a configuration 500b of a pair of coupled qubits with variable capacitive coupling made tunable by the addition of a variable electrostatic transformer controlled by a DC-SQUID. The configuration 500b includes a first qubit 300a, a second qubit 300b, a first conductive path 521 capacitively connecting the first qubit 300a and the second qubit 300b, a second conductive path 522 connecting the first qubit 300a and the second qubit 300b, and a DC-SQUID 570 connecting the first and the second conductive paths 521 and 522 respectively. The loop in the DC-SQUID 530 is threaded by an amount of magnetic flux (not shown in FIG. 5B). The amount of the magnetic flux controls the coupling between the qubits 300a and 300b. For example, if the DC-SQUID 530 is biased to a half flux quantum, then the current through the DC-SQUID 530 is minimized and the coupling is maximized. If the flux is changed to maximize the current through the DC-SQUID 530, the effect is to short the capacitor to ground and thus minimize the coupling. See for example U.S. Pat. No. 8,102,185.

An optional element 540 (indicated by dashed lines) can be included in configuration 500b to provide a bipolar capacitive coupling configuration. Element 540 comprises a capacitor 541 and a voltage source 542.

Figure 5C:
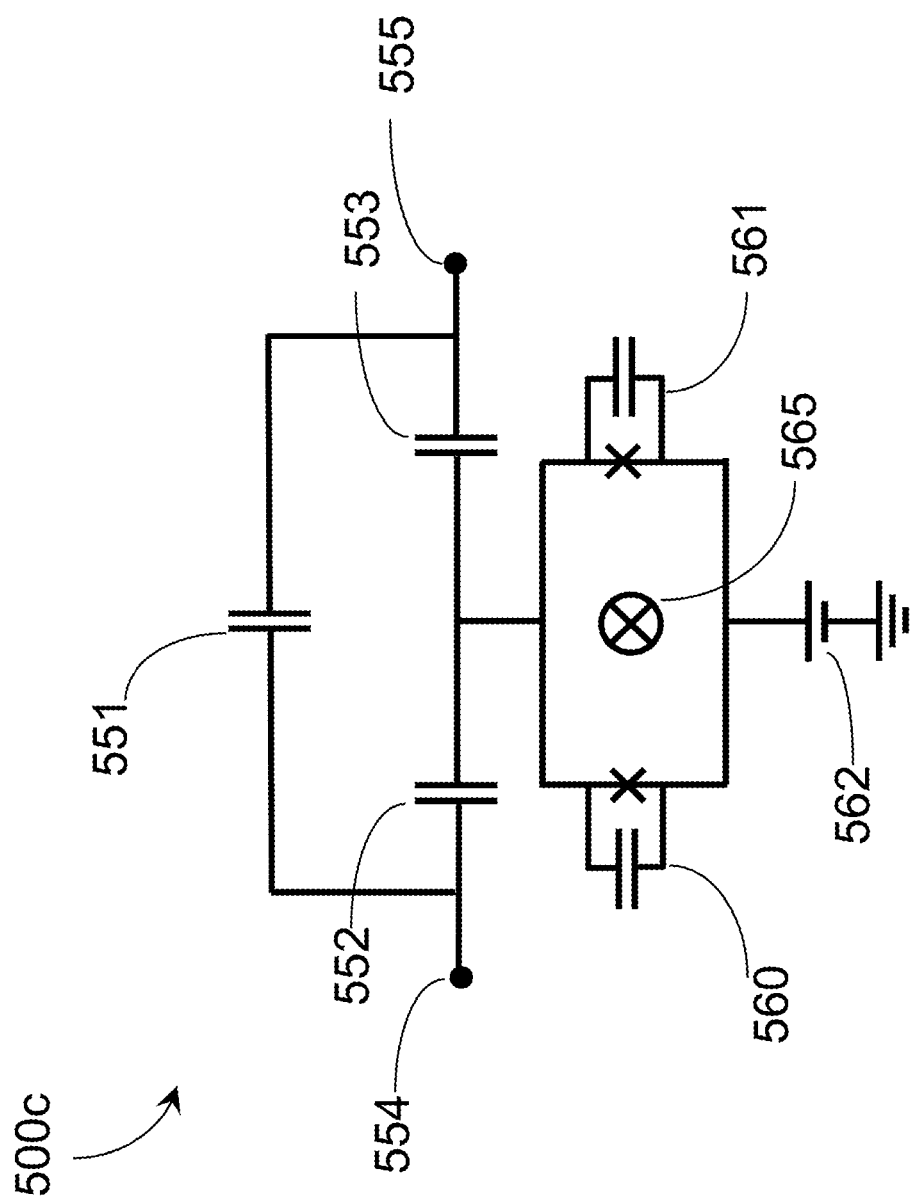
FIG. 5C illustrates an in-situ tunable superconducting capacitive coupler in accordance with the present systems, methods and devices.

FIG. 5C illustrates an in-situ tunable superconducting capacitive coupler 500c between contacts 554 and 555, according to at least one embodiment of the present systems, methods and devices. Coupler 500c comprises fixed capacitances 551, 552 and 553. Coupler 500c further comprises a pair of Josephson junctions 560 and 561, and a voltage source 562. Coupler 500c is threaded by a magnetic flux 565.

Coupler 500c is distinguished in at least one respect from the Averin and Bruder coupler by the flux-biased compound Josephson junction which replaces the single junction of the Averin and Bruder coupler. Coupler 500c is distinguished in at least another respect by fixed capacitance 551. Coupler 500c can be configured such that the sum of the fixed capacitance 551 and the tunable capacitance mediated across capacitances 552 and 553 can be sign- and magnitude-tunable using voltage source 562 and tunable magnetic flux 565.

Figure 5D:
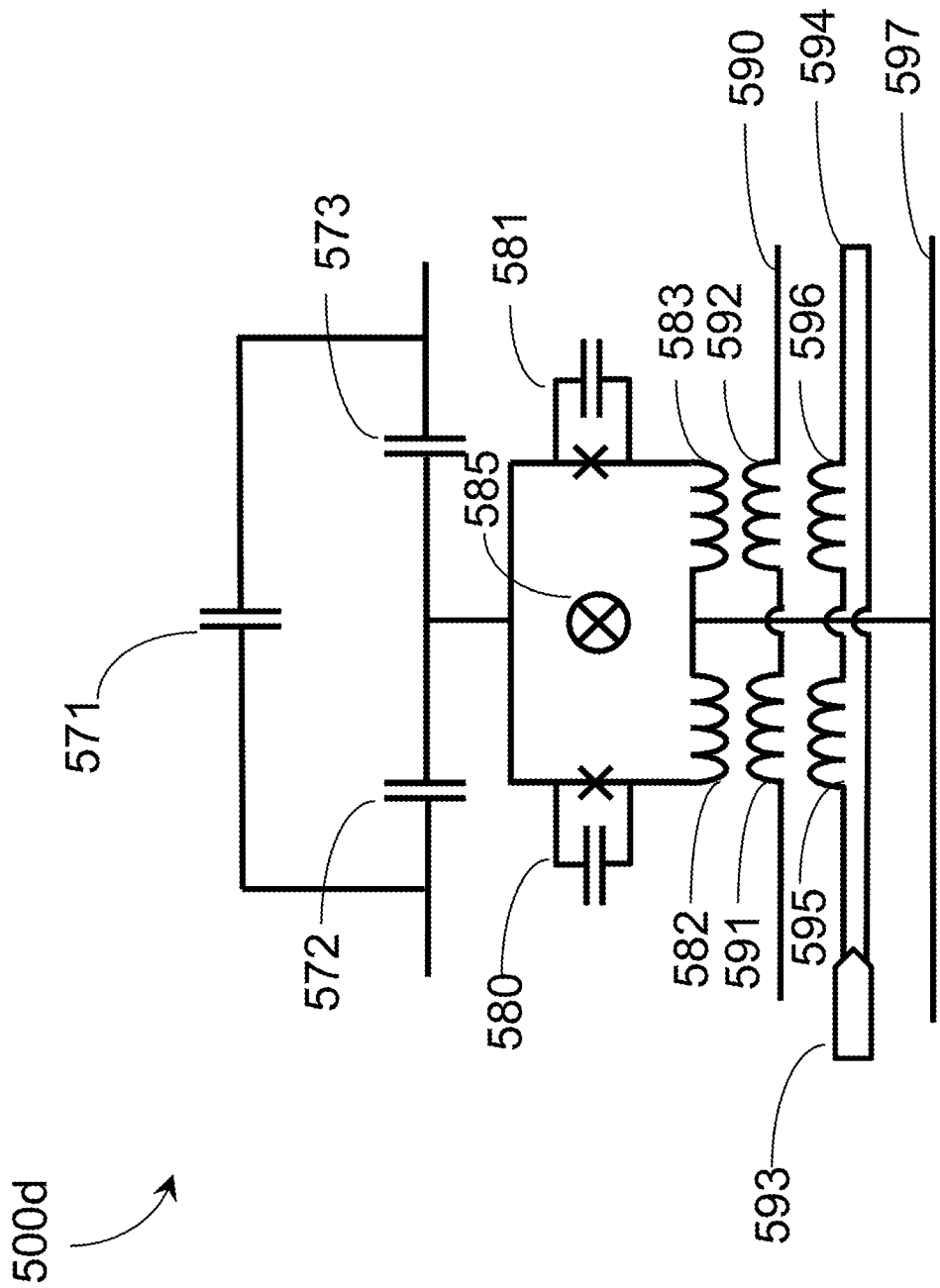
FIG. 5D illustrates an in-situ tunable superconducting capacitive coupler with scalable biasing in accordance with the present systems, methods and devices.

FIG. 5D illustrates an in-situ tunable superconducting capacitive coupler 500d with scalable biasing, according to at least one embodiment of the present systems, methods and devices. Coupler 500d comprises fixed capacitances 571, 572 and 573. Coupler 500d further comprises a pair of Josephson junctions 580 and 581, and inductances 582 and 583. Coupler 500d can be threaded by a magnetic flux 585.

Coupler 500d further comprises a global prebias current analog line 590, a per-coupler flux digital-to-analog converter (DAC) 593 and an associated DAC line 594. Energy can be transferred to the analog line 590 via a first transformer comprising inductances 582 and 591, and a second transformer comprising inductances 583 and 592. Energy can be transferred to the DAC line 594 via a third transformer comprising inductances 582 and 595, and a fourth transformer comprising inductances 583 and 596. Coupler 500d further comprises a global voltage rail 597 supplying a gate voltage to coupler 500d.

Coupler 500d is distinguished in at least one respect from coupler 500c of FIG. 5C by the global voltage rail 597 of coupler 500d which replaces the voltage source 562 of coupler 500c. Voltage rail 597 can be run across a quantum processor comprising one or more pairs of hybrid qubits, and can operate so as to bias capacitive couplers between each of the one or more pairs of qubits.

A scalable method for the application of individually tuned qubit voltage-driven biases can be implemented using a suitable combination of static voltage rails (such as voltage rail 597) and programmable flux biases (such as magnetic flux 585).

The in-situ tunable superconducting capacitive coupler 500d of FIG. 5D can be used a component of a quantum computer system configurable as a universal adiabatic quantum computer, the quantum computer system being described in detail below with reference to FIG. 9B.

Figure 6:
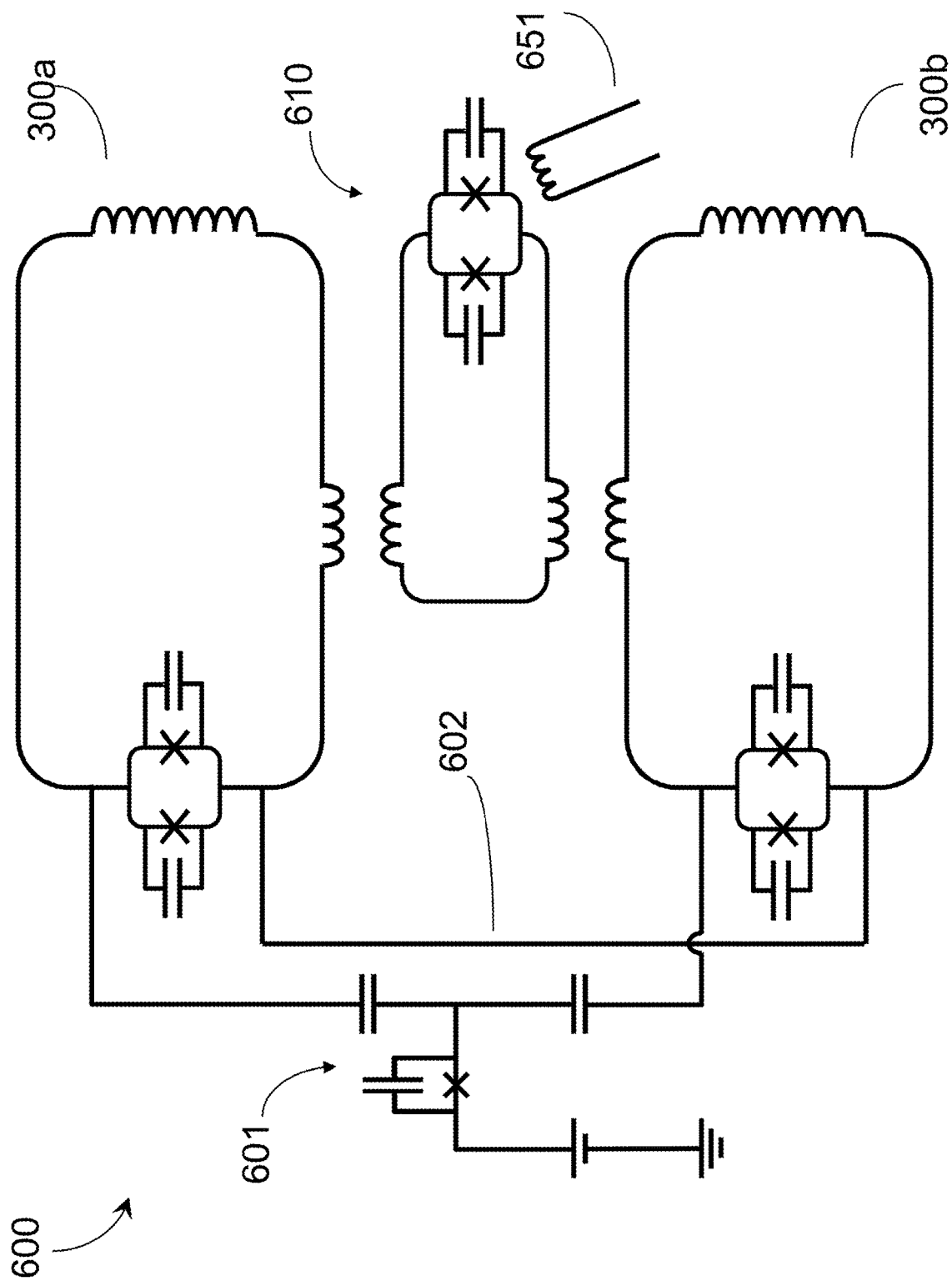
FIG. 6 illustrates a pair of coupled flux qubits with variable capacitive coupling and variable inductive coupling in accordance with the present systems, methods and devices.

FIG. 6 illustrates an arrangement 600 of a pair of coupled qubits 300a and 300b, with variable capacitive coupling and fixed galvanic coupling and variable inductive coupling in accordance with the present systems, methods and devices.

Arrangement 600 includes a pair of qubits 300a and 300b, each of qubits 300a and 300b comprising a compound Josephson junction to allow for a variable off-diagonal single qubit term. A flux signal can be applied to the compound Josephson junction of each of qubits 300a and 300b, thereby tuning a variable magnitude off-diagonal ($d_i$) term in the system Hamiltonian.

The qubits 300a and 300b are coupled by a capacitive coupling and a galvanic coupling. Defining a first path between the qubits is a variable electrostatic transformer 601. Galvanic coupling defines a second path 602. Again, the wires or electrically conductive paths (for example, superconductive traces and/or vias) that define these paths cross. This mixed capacitive and galvanic coupling provides off-diagonal coupling between the qubits 300a and 300b. In accordance with some embodiments, the capacitance in the coupling is made tunable by the addition of a variable electrostatic transformer 601.

Also included in arrangement 600 is a variable inductive coupler 610 between qubits 300a and 300b, and an interface 651. The coupler 610 was described above in reference to FIG. 2 and provides a diagonal two-qubit coupling. The qubits 300a and 300b can be biased with local fluxes to provide diagonal single qubit terms. Together, a Hamilton for the arrangement 600 of coupled qubits 300a and 300b is:

$$H_{FQ1} \propto -\frac{1}{2}\sum_{i=1}^{N}(\Delta_i \sigma_i^x + \varepsilon_i \sigma_i^z) + \sum_{i,j>i}^{N}(J_{ij}^{yy}\sigma_i^y\sigma_j^y + J_{ij}^{zz}\sigma_i^z\sigma_j^z) \quad (10)$$

where $\varepsilon_i$, $J_{ij}^{yy}$ and $J_{ij}^{zz}$ are sign and magnitude tunable and $\Delta_i$ is magnitude tunable.

Figure 7:
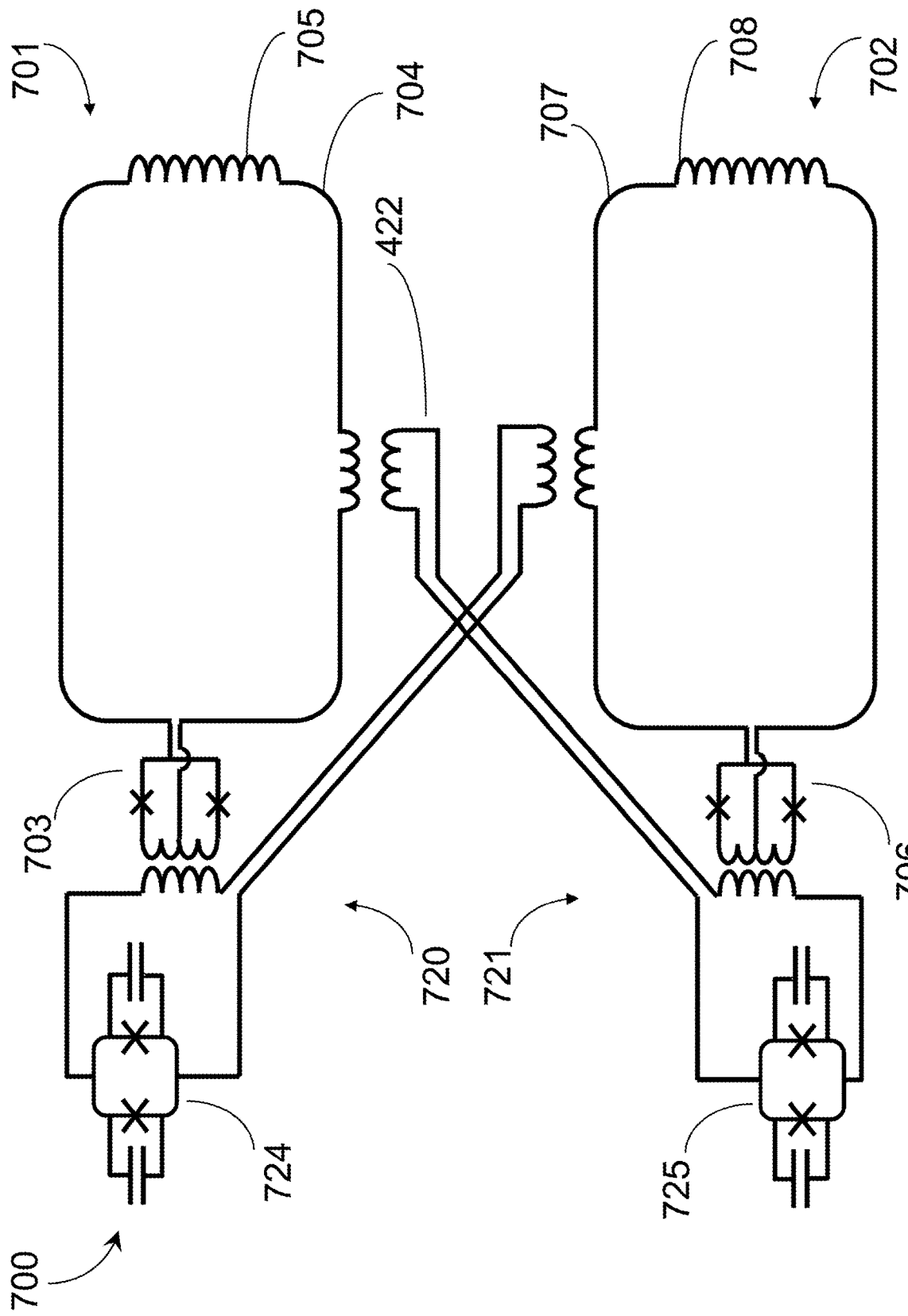
FIG. 7 illustrates a pair of coupled flux qubits variable inductive coupling in accordance with the present systems, methods and devices.

FIG. 7 illustrates a pair of coupled flux qubits variable inductive coupling in accordance with the present systems, methods and devices. A first flux qubit 701 includes a compound Josephson junction 703 interrupting a loop of superconducting material 704 comprising an inductance 705. In some embodiments, the loop 704 can be threaded by a flux of about one half flux quantum.

Compound Josephson junction 703 comprises two essentially identical constituent Josephson junctions each characterized by a critical current, a junction capacitance and a superconducting phase drop. Differences (non-identically) in the Josephson junctions included in the compound Josephson junction can be addressed by making the constituent Josephson junctions themselves compound Josephson junctions. The compound Josephson junction can be subjected to an applied external flux bias.

Qubit 702 is similarly designed and operated. Qubit 702 comprises a Josephson junction 706 and a loop of superconducting material 707 comprising an inductance 708.

The qubits 701 and 702 are coupled by a plurality of inductive couplings that provide an off-diagonal coupling. Coupler 720 provides an XZ coupling. Coupler 721 provides a ZX coupling. The coupler 720 is coupled to the loop 707 of qubit 702 and to the compound Josephson junction 703 of qubit 701. The flux in qubit 702 induces a flux in qubit 701 via the compound Josephson junction 703 of qubit 701. The corresponding coupler 721 couples to the loop 704 of qubit 701 and to the compound Josephson junction 706 of qubit 702. The coupling 720 can be tuned via a compound Josephson junction 724. Similarly, the coupling 721 can be tuned via a compound Josephson junction 725.

The qubits 701 and 702 can be biased with local fluxes to provide a diagonal single qubit term. Together, a Hamilton for the arrangement of coupled qubits 700 is:

$$H_{FQ2} \propto -\frac{1}{2}\sum_{i=1}^{N}(\Delta_i \sigma_i^x + \varepsilon_i \sigma_i^z) + \sum_{i,j>i}^{N}(J_{ij}^{zx}\sigma_i^z\sigma_j^x + J_{ij}^{xz}\sigma_i^x\sigma_j^z) \quad (11)$$

where $\varepsilon_i$, $J_{ij}^{zx}$ and $J_{ij}^{xz}$ are sign and magnitude tunable and $\Delta_i$ is magnitude tunable. See U.S. Pat. No. 7,605,600.

Figure 8:
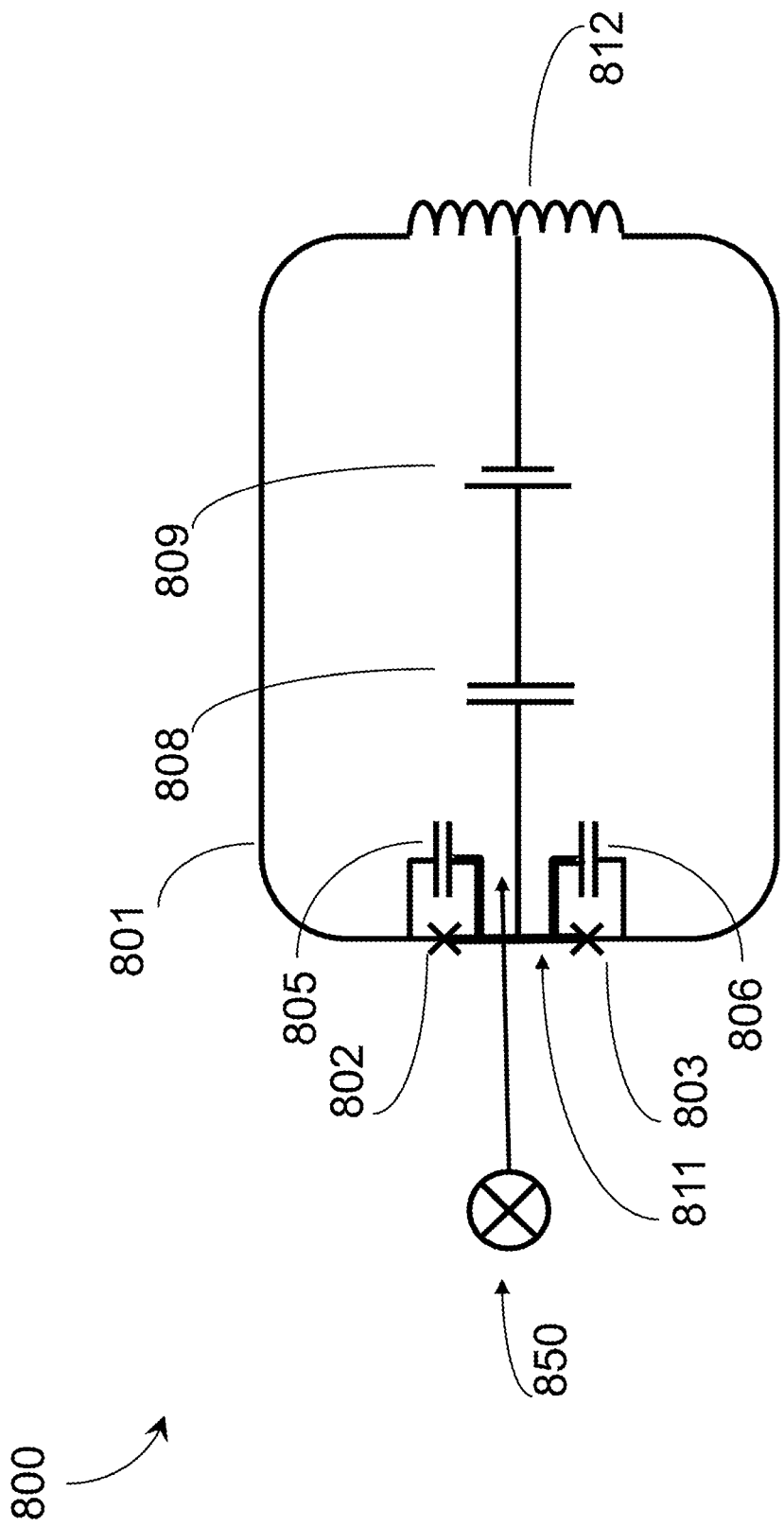
FIG. 8 illustrates a hybrid flux-charge qubit.

FIG. 8 illustrates a hybrid flux-charge qubit. The qubit 800 includes a loop of superconducting material 801 interrupted by two Josephson junctions 802 and 803, and an island 811 between Josephson junctions 802 and 803, the island 811 comprising superconducting material. The island 811 is indicated by thicker lines in FIG. 8. The Josephson junctions 802 and 803 have intrinsic capacitances 805 and 806 respectively. In some embodiments, Josephson junctions 802 and 803 can be compound Josephson junctions. A static amount of charge can be drawn onto the island 811 from the loop of superconducting material 801 via a gate voltage source 809 ($V_g$) that is coupled to the island via a gate capacitor 808 with capacitance $C_g$. The number of Cooper pairs of electrons drawn onto the island 811 by the gate voltage source 809 can be written as $N_e = C_g V_g/2e$. The loop of superconducting material 801 can have an inductance 812 that is large enough such that the qubit 800 becomes bistable when subject to an applied external magnetic flux bias 850 of about one-half flux-quantum in the loop 801.

The hybrid qubit can be operated in a flux regime or in a charge regime as determined by the ratio of the Josephson energy to the charging energy of the hybrid qubit. The flux regime is defined as the regime in which the absolute value of the ratio of the Josephson energy to the charging energy of the hybrid qubit (such as the qubit 800) is approximately less than or equal to unity. The charge regime is defined as the regime in which the absolute value of the ratio of the Josephson energy to the charging energy of the hybrid qubit (such as the qubit 800) is approximately greater than or equal to unity.

In some embodiments, the tunneling amplitude of the qubit 800 can be controlled by the voltage gate source 809. The dependence of the tunneling on the gate voltage $V_g$ provided by gate voltage source 809 is via a cosine function:

$$\Delta = 2\Delta_0 \cos(C_g V_g \pi/2e)$$

where $\Delta_0$ is the tunneling rate in the absence of a voltage. The tunneling rate is sign- and magnitude-tunable. Moreover, changing gate voltage $V_g$ does not affect the classical potential and therefore the persistent current of the qubit 800. Therefore, the gate voltage $V_g$ and associated off-diagonal term can be changed without affecting other tunable parameters.

In operation of qubit 800, the total flux bias is defined by the presence or absence of a full flux quantum inside the loop of superconducting material 801. The flux quantum can enter or leave the superconducting loop 801 via Josephson junction 802 and/or Josephson junction 803. Josephson junctions 802 and 803 are considered weak links in the loop 801.

For $N_e = 2m$, where m is an integer, there is constructive interference and no change to the phase of the flux quantum. For $N_e = m + \frac{1}{2}$, there is destructive interference and the flux qubit will not be able to change state. For $N_e = 2m+1$ there is again constructive interference, but with a change in phase to the flux quantum. See, J. R. Friedman, and D. V. Averin, 2002, "Aharonov-Casher-Effect Suppression of Macroscopic Tunneling of Magnetic Flux" Phys. Rev. Lett. 88, 050403 (preprint arXiv:cond-mat/0109544).

Figure 9A:
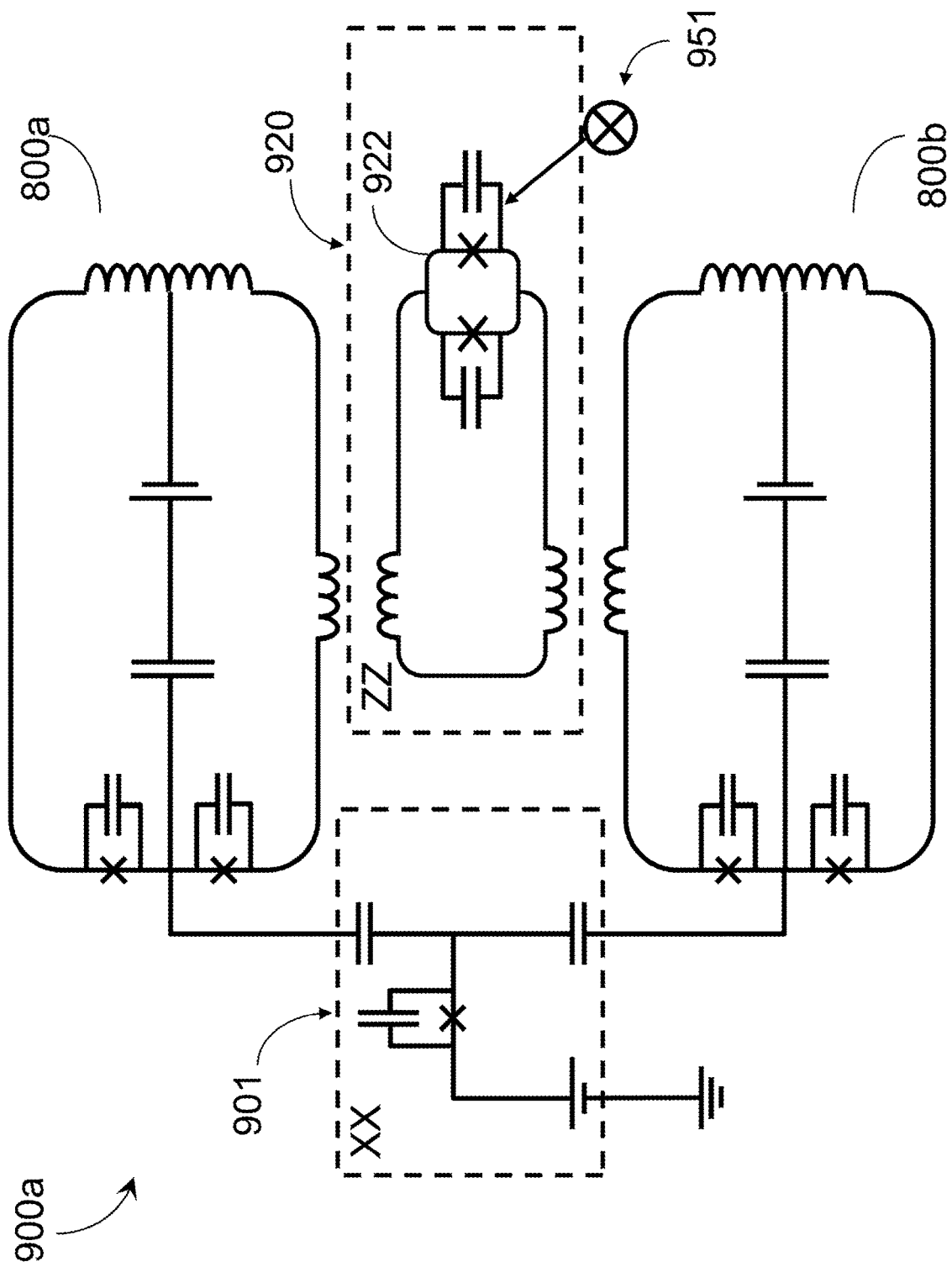
FIG. 9A illustrates a pair of coupled hybrid flux-charge qubits with variable capacitive coupling and variable inductive coupling in accordance with the present systems, methods and devices.

FIG. 9A illustrates a pair of coupled hybrid flux-charge qubits with variable capacitive coupling and variable inductive coupling in accordance with the present systems, methods and devices. A first hybrid qubit 800a and a second hybrid qubit 800b are coupled via a variable capacitive coupling 901 between the islands of the qubits. The capacitive coupling 901 between the qubits 800a and 800b provides for an off-diagonal coupling (XX) that is sign and magnitude tunable.

In operation, each of the first hybrid qubit 800a and the second hybrid qubit 800b are threaded by a flux of about one half flux quantum (not shown in FIG. 9A). The first hybrid qubit 800a and the second hybrid qubit 800b are also coupled via a tunable inductive transformer 920. The inductive transformer 920 can be tuned by a compound Josephson junction 922 that is controlled by a magnetic flux 951. This inductive coupling between qubits 800a and 800b provides for a diagonal coupling (ZZ) that is sign and magnitude tunable. Together a Hamilton for the coupled qubits 900 is:

$$H_{HQ} \propto -\frac{1}{2}\sum_{i=1}^{N}(\Delta_i \sigma_i^x + \varepsilon_i \sigma_i^z) + \sum_{i,j>i}^{N}(J_{ij}^{yy}\sigma_i^y\sigma_j^y + J_{ij}^{zz}\sigma_i^z\sigma_j^z) \quad (12)$$

where $\varepsilon_i$, $J_{ij}^{yy}$ and $J_{ij}^{zz}$ are sign and magnitude tunable and $\Delta_i$ is sign- and magnitude-tunable.

Figure 9B:
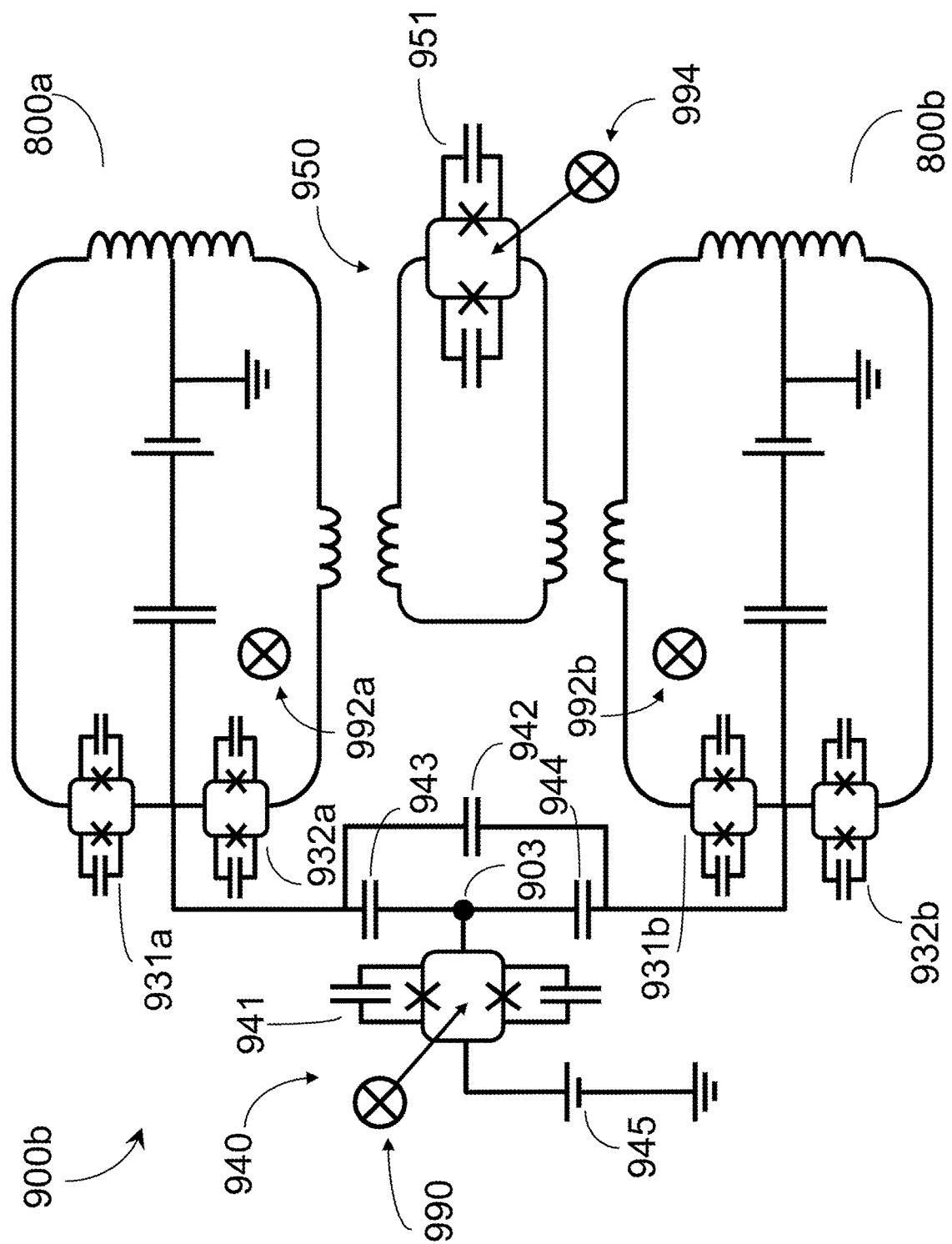
FIG. 9B illustrates an embodiment of a quantum computer system configurable as a universal adiabatic quantum computer in accordance with the present systems, methods and devices.

FIG. 9B illustrates an embodiment of a quantum computer system 900b configurable or operable as a universal adiabatic quantum computer coupling in accordance with the present systems, methods and devices. System 900b comprises a pair of hybrid qubits 800a and 800b. Qubit 800a comprises a pair of compound Josephson junctions 931a and 932a, and qubit 800b comprises a pair of compound Josephson junctions 931b and 932b. Qubits 800a and 800b are threaded by a flux 992a and 992b respectively.

System 900b further comprises a capacitive coupler 940 and an inductive coupler 950. Capacitive coupler 940 comprises a compound Josephson junction 941, fixed capacitor 942, and tunable capacitors 943 and 944 to which fixed capacitor 942 is coupled at node 903, and voltage source 945. Compound Josephson junction 941 is threaded by a flux 990. Inductive coupler 950 comprises a compound Josephson junction 951 threaded by a flux 994.

FIGS. 9A and 9B illustrate embodiments of a quantum computer system 900a and 900b respectively that provide diagonal (for example, ZZ coupling) and off-diagonal coupling (for example, XX or YY coupling) between the qubits 800a and 800b. If the hybrid qubits 800a and 800b are operated in the flux regime, then the inductive coupling is ZZ coupling and the capacitive coupling is XX coupling. If the hybrid qubits 800a and 800b are operated in the charge regime, then the inductive coupling is XX coupling and the capacitive coupling is ZZ coupling.

The system 900b can be a practical hybrid qubit architecture configurable to provide a scalable implementation of a universal adiabatic quantum computer.

Figure 10:
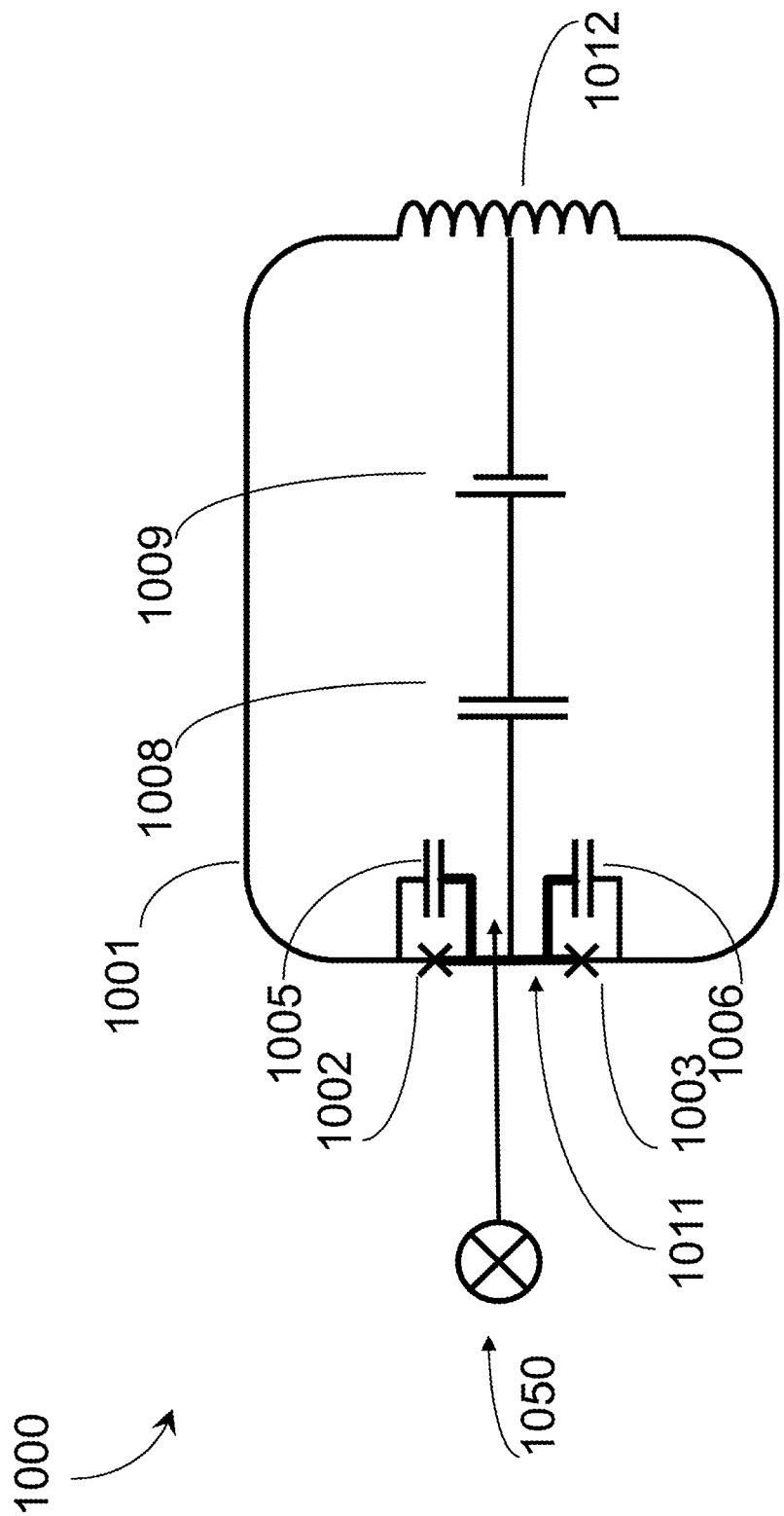
FIG. 10 illustrates a hybrid flux-charge qubit, in the charge regime.

FIG. 10 illustrates a hybrid flux-charge qubit 1000 in the charge regime. The elements of FIG. 10 are essentially the same in many respects as the elements of FIG. 8. A difference is that the hybrid flux-charge qubit of FIG. 8 is generally described in reference to a hybrid qubit operating in the flux regime, whereas the hybrid flux-charge qubit 1000 of FIG. 10 is generally described in reference to a hybrid qubit operating in the charge regime.

The qubit 1000 includes a loop of superconducting material 1001 interrupted by two Josephson junctions 1002 and 1003 that define an island of superconducting material 1011. In some embodiments, Josephson junctions 1002 and 1003 can be compound Josephson junctions. The Josephson junctions 1002 and 1003 have intrinsic capacitances 1005 and 1006, respectively. A static amount of charge can be drawn onto the island from the loop of superconducting material 1001 via a gate voltage source 1009 ($V_g$) that is coupled to the island via a gate capacitor 1008 with capacitance $C_g$. The total capacitance of the island defines the charging energy of the hybrid qubit 1000. The loop of superconducting material 1001 can have a small but finite inductance 1012. Inductance 1012 can be less than inductance 812 of loop 801 in qubit 800. The states of the qubit 1000 are presence and absence of excess Cooper pairs on the island 1011. Therefore, the capacitive couplings (not shown in FIG. 10) are diagonal on the Hamiltonian and other couplings provide the off-diagonal coupling.

Figure 11:
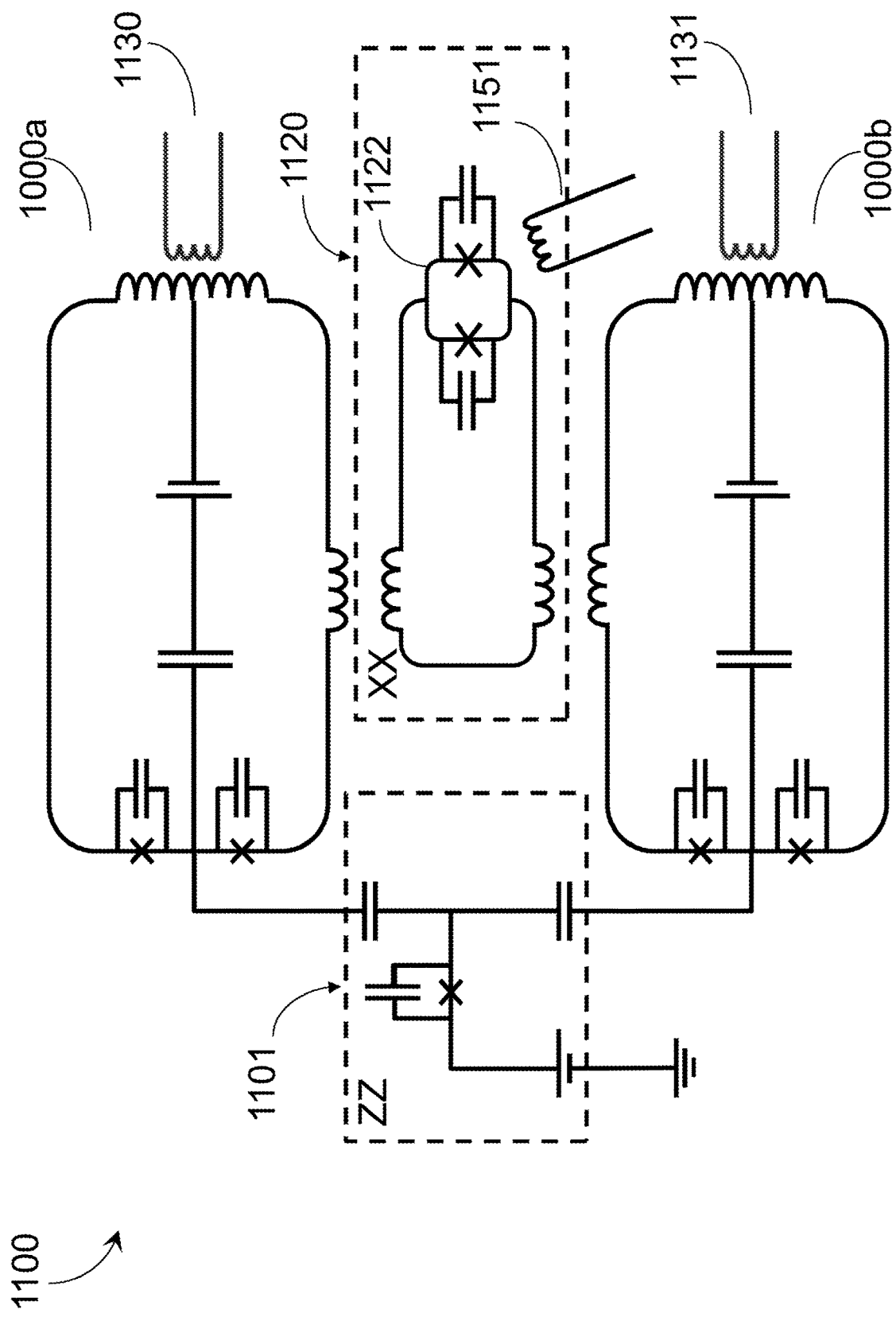
FIG. 11 illustrates a pair of hybrid flux-charge qubits coupled with variable capacitive coupling and variable inductive coupling in accordance with the present systems, methods and devices.

FIG. 11 illustrates a pair of hybrid flux-charge qubits coupled with variable capacitive coupling and variable inductive coupling in accordance with the present systems, methods and devices. A first hybrid qubit 1000a and a second hybrid qubit 1000b are coupled via a capacitance 1101 between the islands of the qubits. In some embodiments the capacitance is made variable via a variable electrostatic transformer. This capacitive coupling between qubits 1000a and 1000b provides for diagonal coupling (ZZ) that is sign and magnitude tunable. In some embodiments, the first hybrid qubit 1000a may include an interface to provide a tunable off-diagonal term. The interface 1130 provides a magnetic flux bias to hybrid qubit 1000a. The interface 1131 provides a magnetic flux bias to hybrid qubit 1000a.

The first hybrid qubit 1000a and the second hybrid qubit 1000b are also coupled via an inductive transformer 1120. The inductance 1120 is tunable by a compound Josephson junction 1122 that is controlled by interface 1151. This inductive coupling between qubits 1000a and 1000b provides for an off-diagonal coupling (XX) that is sign and magnitude tunable. A Hamiltonian for the coupled qubits 1100 can be expressed as:

$$H_{CQ} \propto -\frac{1}{2}\sum_{i=1}^{N}(\Delta_i \sigma_i^x + \varepsilon_i \sigma_i^z) + \sum_{i,j>i}^{N}(J_{ij}^{xx}\sigma_i^x\sigma_j^x + J_{ij}^{zz}\sigma_i^z\sigma_j^z) \quad (13)$$

where $\Delta_i$, $\varepsilon_i$, $J_{ij}^{yy}$ and $J_{ij}^{zz}$ are sign and magnitude tunable.

In some embodiments, a pair of hybrid flux-charge qubits can be coupled with fixed capacitive coupling and/or fixed inductive coupling.

Figure 12A:
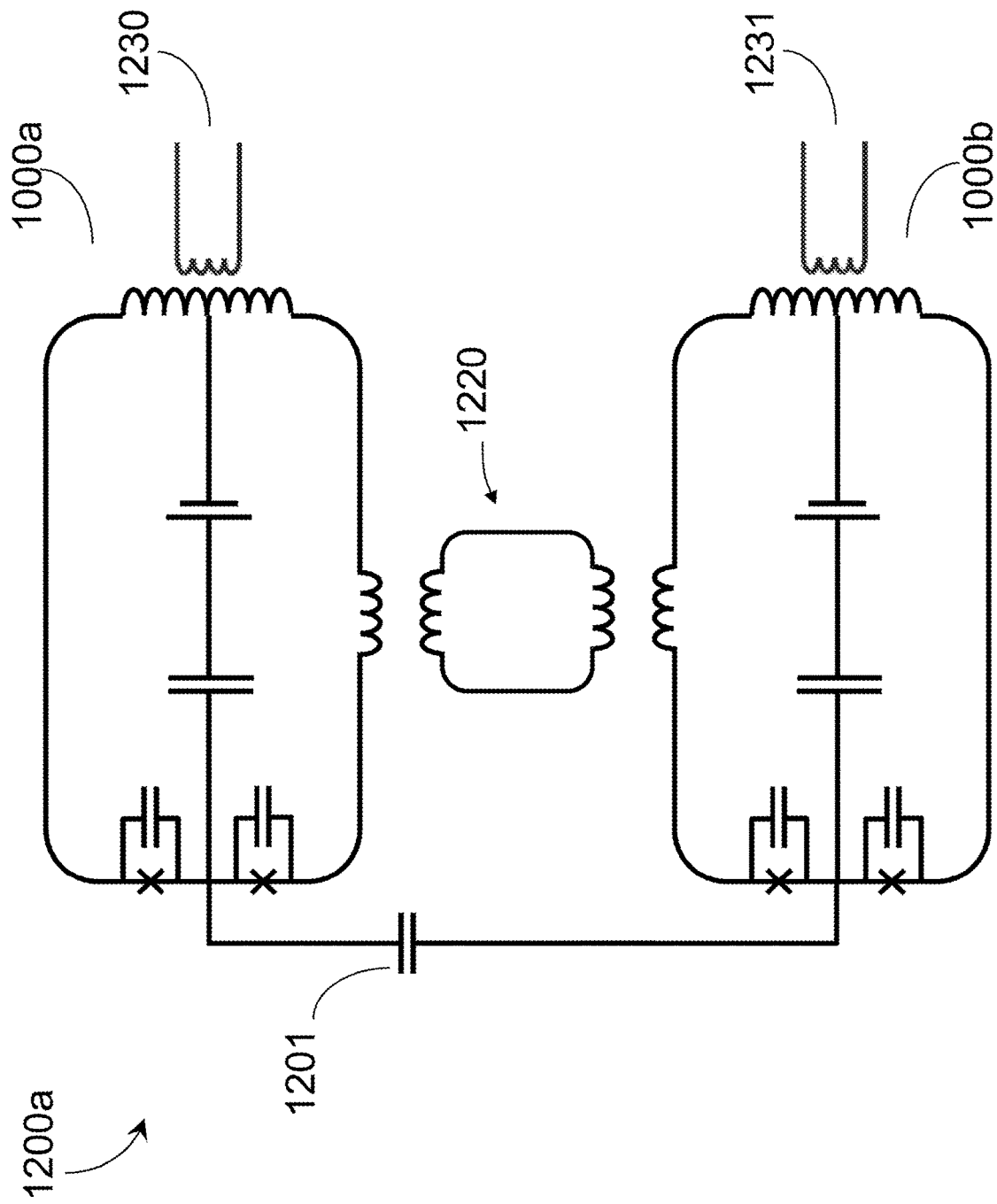
FIG. 12A illustrates a pair of hybrid flux-charge qubits coupled with fixed capacitive coupling and fixed inductive coupling in accordance with the present systems, methods and devices.

FIG. 12A illustrates a pair of hybrid flux-charge qubits coupled with fixed capacitive coupling and fixed inductive coupling in accordance with the present systems, methods and devices. The coupled qubits 1200a are similar in at least some respects to the coupled qubits 1100. However, the variable capacitive coupler has been replaced by a fixed capacitance and the variable inductor has been replaced with a fixed inductance 1220. Tunable off-diagonal coupling is achieved by biasing the first hybrid qubit 1000a or the second hybrid qubit 1000b.

Figure 12B:
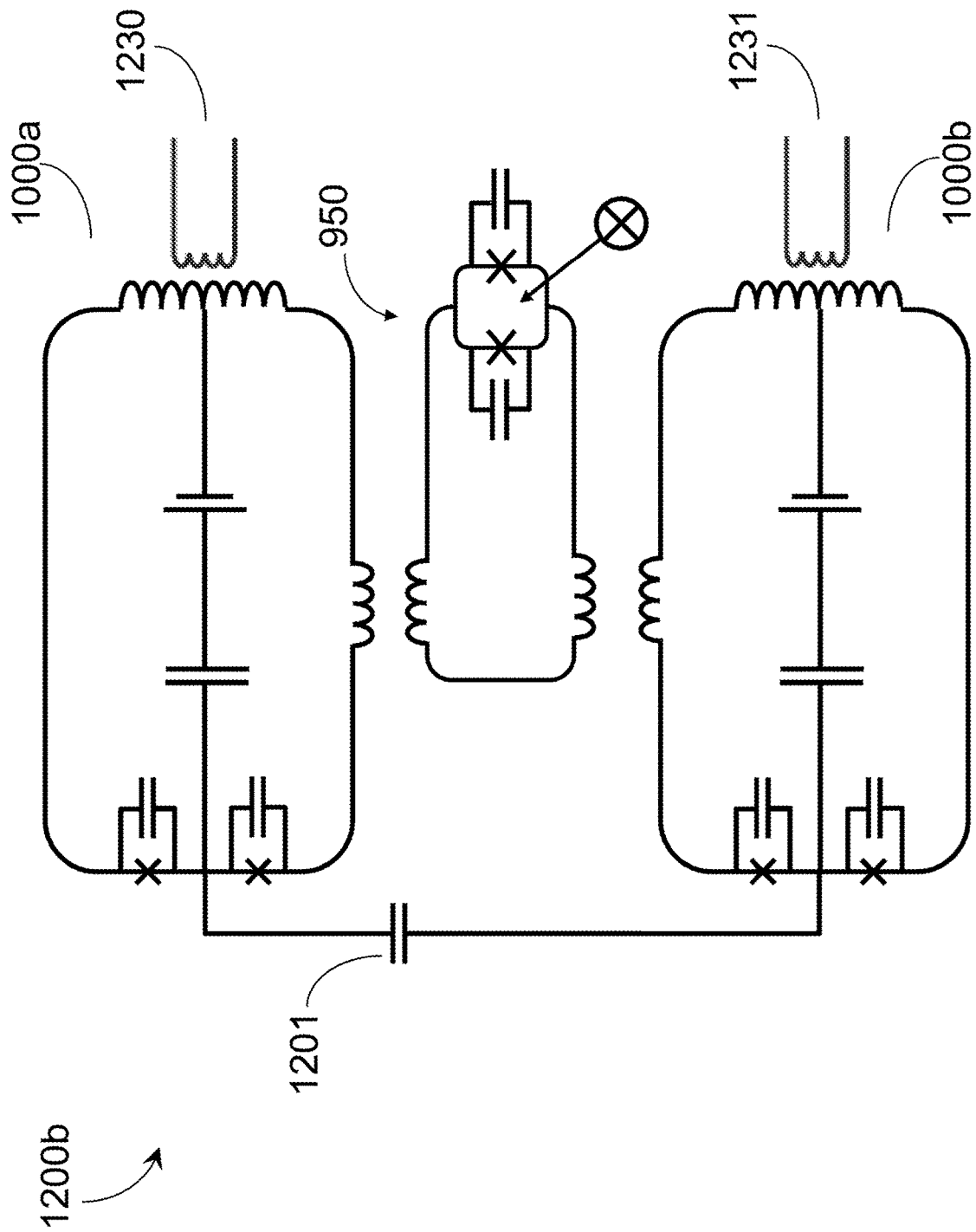
FIG. 12B illustrates a pair of hybrid flux-charge qubits coupled with fixed capacitive coupling and variable inductive coupling in accordance with the present systems, methods and devices.

FIG. 12B illustrates a pair of hybrid flux-charge qubits coupled with fixed capacitive coupling and variable inductive coupling in accordance with the present systems, methods and devices. The fixed inductance 1220 of FIG. 12A has been replaced by a variable inductive coupling 950 (see also for example FIG. 9B).

A pair of hybrid flux-charge qubits coupled with variable capacitive coupling and variable inductive coupling is illustrated above in FIGS. 9A, 9B and 11.

For the sake of clarity, only a single pair of coupled qubits is shown in FIGS. 12A and 12B, however a person of skill in the art will appreciate an array or tiling of qubits and couplers can be employed. This is similarly so for the pairs of coupled qubits in FIGS. 2, 4-6, 7, 9A, 9B, and 11.

From a practical perspective, one of the attractive features of AQO is that the final state of the processor is always a localized spin state. It can be stated that the AQO algorithm is the measurement that collapses the quantum mechanical wavefunction of the system of coupled qubits. One can then raise the tunnel barriers of the individual qubits high enough such that backaction from the readout circuit becomes irrelevant. This makes it possible to build scalable AQO processor readout circuits that can operate to high precision.

Readout is likely more challenging in AQC than in GMQC. Within the latter paradigm, all qubits are isolated at the end of a computation. Consequently, one can independently read each qubit in a GMQC processor. In contrast, AQC terminates with the target Hamiltonian being asserted. When the Hamiltonian contains off-diagonal elements, read out for AQC can present a challenge. If the readout process requires the qubit register wavefunction to collapse, then that state will no longer be an eigenstate of the target Hamiltonian. Therefore, it is desirable to devise a method to simultaneously project the states of all qubits in an AQC processor in the presence of finite biases and couplings.

Figure 13:
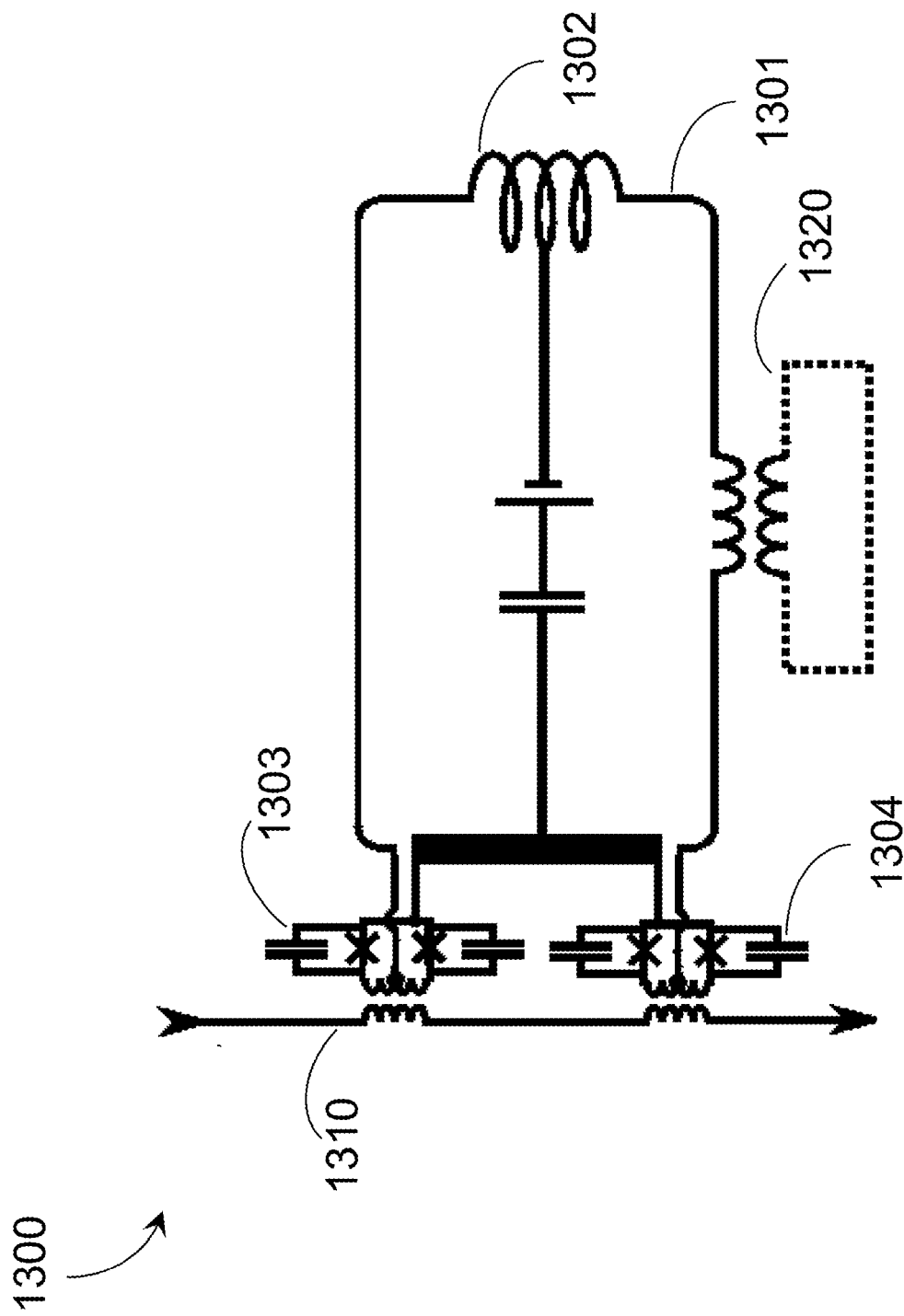
FIG. 13 illustrates a modified hybrid qubit that facilitates a latching readout in accordance with the present systems, methods and devices.

FIG. 13 illustrates a modified hybrid qubit 1300 that facilitates a latching readout in accordance with the present systems, methods and devices. The modified hybrid qubit 1300 comprises a superconducting loop 1301, a body inductance 1302, and a pair of compound Josephson junctions (CJJs) 1303 and 1304. The CJJs 1303 and 1304 can be inductively coupled to a common current bias line 1310. The bias line 1310 can be shared across two or more qubits in a scalable processor.

In operation, the bias line 1310 can be set to a dc level in qubit operation during AQC evolution. To read the states of the two or more qubits in the scalable processor, a fast step (fast compared to the qubit tunneling timescale) can be applied to the bias line 1310. The effect is to raise the effective critical current of all CJJs (such as 1303 and 1304) in the qubits sharing the bias line 1310 in the scalable processor, resulting in the qubits being localized in either one of the two basis states.

A quantum annealing processor readout scheme can be used to pass the final qubit states through a scalable shift register 1320 and then on to a small number of high fidelity readout devices (not shown in FIG. 13). In some embodiments, shift register 1320 can be a quantum flux parametron shift register.

In some embodiments, an in-situ compensation of the qubit body inductance (such as body inductance 1302 of FIG. 13) as a function of the inductive coupler settings can be desirable for high precision operation of hybrid qubits. The in-situ compensation can account for the capacitive loading of the superconducting islands as a function of tunable inter-qubit capacitors.

FIG. 14 illustrates computing system 1400 including a digital computer 1401 coupled to a quantum computer 1451 in accordance with the present systems, methods and devices. Shown is an exemplary digital computer 1401 including a digital processor that may be used to perform classical digital processing tasks described in the present systems and methods. Those skilled in the relevant art will appreciate that the present systems and methods can be practiced with other digital computer configurations, including hand-held devices, multiprocessor systems, microprocessor-based or programmable consumer electronics, personal computers ("PCs"), network PCs, mini-computers, mainframe computers, and the like. Digital computer 1401 will at times be referred to in the singular herein, but this is not intended to limit the application to a single digital computer. The present systems and methods can also be practiced in distributed computing environments, where tasks or modules are performed by remote processing devices, which are linked through a communications network. In a distributed computing environment, program modules may be located in both local and remote memory storage devices.

Digital computer 1401 may include at least one processing unit (such as, central processor unit 1410), at least one system memory 1420, and at least one system bus 1417 that couples various system components, including system memory 1420 to central processor unit 1410.

The digital processor may be any logic processing unit, such as one or more central processing units ("CPUs"), digital signal processors ("DSPs"), application-specific integrated circuits ("ASICs"), etc. Unless described otherwise, the construction and operation of the various blocks shown in FIG. 14 are of conventional design. As a result, such blocks need not be described in further detail herein, as they will be understood by those skilled in the relevant art.

System bus 1417 can employ any known bus structures or architectures, including a memory bus with a memory controller, a peripheral bus, and a local bus. System memory 1420 may include non-volatile memory such as read-only memory ("ROM") and volatile memory such as random access memory ("RAM") (not shown). An basic input/output system ("BIOS") 1421, which can form part of the ROM, contains basic routines that help transfer information between elements within digital computer 1401, such as during startup.

Digital computer 1401 may also include other non-volatile memory 1415. Non-volatile memory 1415 may take a variety of forms, including: a hard disk drive for reading from and writing to a hard disk, an optical disk drive for reading from and writing to removable optical disks, and/or a magnetic disk drive for reading from and writing to magnetic disks. The optical disk can be a CD-ROM or DVD, while the magnetic disk can be a magnetic floppy disk or diskette. Non-volatile memory 1415 may communicate with digital processor via system bus 1417 and may include appropriate interfaces or controllers 1416 coupled to system bus 1416. Non-volatile memory 1415 may serve as long-term storage for computer-readable instructions, data structures, program modules and other data for digital computer 1401. Although digital computer 1401 has been described as employing hard disks, optical disks and/or magnetic disks, those skilled in the relevant art will appreciate that other types of non-volatile computer-readable media may be employed, such a magnetic cassettes, flash memory cards, Bernoulli cartridges, Flash, ROMs, smart cards, etc.

Various program modules, application programs and/or data can be stored in system memory 1420. For example, system memory 1420 may store an operating system 1423, and server modules 1427. In some embodiments, server module 1427 includes instruction for communicating with remote clients and scheduling use of resources including resources on the digital computer 1401 and quantum computer 1451. For example, a Web server application and/or Web client or browser application for permitting digital computer 1401 to exchange data with sources via the Internet, corporate Intranets, or other networks, as well as with other server applications executing on server computers.

In some embodiments system memory 1420 may store one or more calculation modules 1431 to perform pre-processing, co-processing, and post-processing to quantum computer 1451. In accordance with the present systems and methods, system memory 1420 may store a set of quantum computer interface modules 1435 operable to interact with the quantum computer 1451. While shown in FIG. 14 as being stored in system memory 1420, the modules shown and other data can also be stored elsewhere including in nonvolatile memory 1415.

The quantum computer 1451 is provided in an isolated environment (not shown) to shield the internal elements of the quantum computer from heat, magnetic field, and the like. The quantum computer includes a quantum processor 1440 including qubits (not shown in FIG. 14) having programmable topology as discussed herein. The qubits are read out via a readout control system 1460. These results are fed to the various modules in the digital computer 1401 including server modules 1427, calculation modules 1431, and quantum computer interface modules 1435, stored in nonvolatile memory 1415, returned over a network or the like. The qubits can be controlled via a qubit control system 1465. The quantum processor 1440 further comprises one or more coupling devices (not shown in FIG. 14), and the coupling devices can be controlled via a coupling device control system 1470. In some embodiments, the qubit control system 1465 and the coupling device control system 1470 can be used to implement quantum annealing as described herein on the quantum processor 1440.

In some embodiments, the digital computer 1401 can operate in a networking environment using logical connections to at least one client computer system. In some embodiments, the digital computer 1401 is coupled via logical connections to at least one database system. These logical connections may be formed using any means of digital communication, for example, through a network, such as a local area network ("LAN") or a wide area network ("WAN") including, for example, the Internet. The networking environment may include wired or wireless enterprise-wide computer networks, intranets, extranets, and/or the Internet. Other embodiments may include other types of communication networks such as telecommunications networks, cellular networks, paging networks, and other mobile networks. The information sent or received via the logical connections may or may not be encrypted. When used in a LAN networking environment, digital computer 1401 may be connected to the LAN through an adapter or network interface card ("NIC") (communicatively linked to bus 1417). When used in a WAN networking environment, digital computer 1401 may include an interface and modem (not shown), or a device such as NIC, for establishing communications over the WAN. Non-networked communications may additionally, or alternatively be employed.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other analog processors, not necessarily the exemplary quantum processors generally described above.

The various embodiments described above can be combined to provide further embodiments. To the extent that they are not inconsistent with the specific teachings and definitions herein, all of the U.S. patents, U.S. patent application publications, U.S. patent applications, referred to in this specification and/or listed in the Application Data Sheet including U.S. provisional patent application Ser. No. 61/894,267 filed on Oct. 22, 2013, and Ser. No. 61/832,645 filed Jun. 7, 2013 are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A tunable superconducting capacitive coupler to communicatively couple a pair of qubits, the tunable superconducting capacitive coupler comprising:
   a pair of coupling capacitors in series with one another;
   a fixed capacitor in parallel with the pair of coupling capacitors, and
   a compound Josephson junction connected to a node between the coupling capacitors of the pair of coupling capacitors, the compound Josephson junction responsive to a flux bias to tune a sign and a magnitude of a sum of a capacitance of the fixed capacitor and a tunable capacitance which is mediated across the pair of coupling capacitors.

2. The tunable superconducting capacitive coupler of claim 1, further comprising:
   a node which connects to a voltage source to provide a gate voltage to the compound Josephson junction.

3. The tunable superconducting capacitive coupler of claim 1, further comprising:
   a node which connects to a voltage rail to provide a gate voltage to the compound Josephson junction of the tunable superconducting capacitive coupler and to one or more additional tunable superconducting capacitive couplers.

4. The tunable superconducting capacitive coupler of claim 1 wherein the compound Josephson junction is directly connected to the node between the coupling capacitors of the pair of coupling capacitances.

* * * * *

UNITED STATES PATENT AND TRADEMARK OFFICE
CERTIFICATE OF CORRECTION

PATENT NO. : 11,348,024 B2
APPLICATION NO. : 16/029040
DATED : May 31, 2022
INVENTOR(S) : Richard G. Harris et al.

It is certified that error appears in the above-identified patent and that said Letters Patent is hereby corrected as shown below:

In the Specification

Column 9, Line 6:

" $$H_{1/2} \propto \sum_{i=1}^{N} (d_i \sigma_i^x + h_i \sigma_i^z) + \sum_{i,j>i}^{N} (J_{ij}^{zx} \sigma_i^z \sigma_j^z + J_{ij}^{xy} \sigma_i^x \sigma_j^x)$$ " should read, -- $$H_{1/2} \propto \sum_{i=1}^{N} (d_i \sigma_i^x + h_i \sigma_i^z) + \sum_{i,j>i}^{N} (J_{ij}^{zx} \sigma_i^z \sigma_j^x + J_{ij}^{xz} \sigma_i^x \sigma_j^z)$$ --.

Signed and Sealed this
Sixth Day of September, 2022

Katherine Kelly Vidal
*Director of the United States Patent and Trademark Office*